US008789988B2

(12) United States Patent
Goldwater

(10) Patent No.: US 8,789,988 B2
(45) Date of Patent: Jul. 29, 2014

(54) FLEXIBLE LED LIGHT STRIP FOR A BICYCLE AND METHOD FOR MAKING THE SAME

(76) Inventor: Dan Goldwater, Amherst, MA (US)

( * ) Notice: Subject to any disclaimer, the term of this patent is extended or adjusted under 35 U.S.C. 154(b) by 176 days.

(21) Appl. No.: 13/187,588

(22) Filed: Jul. 21, 2011

(65) Prior Publication Data

US 2013/0021811 A1 Jan. 24, 2013

(51) Int. Cl.
*B62J 6/00* (2006.01)
*F21V 33/00* (2006.01)
*B62J 6/20* (2006.01)
*B62K 19/40* (2006.01)
*B60Q 1/26* (2006.01)

(52) U.S. Cl.
CPC .... *B62J 6/20* (2013.01); *B62J 6/00* (2013.01); *B60Q 1/2696* (2013.01); *B62K 19/40* (2013.01)
USPC .................. 362/473; 362/249.01; 362/217.01

(58) Field of Classification Search
CPC ............ B62J 6/20; B62J 6/00; B60Q 1/2696; B60Q 1/0011; B62K 19/04
USPC ................................ 362/473, 249.01, 217.01
See application file for complete search history.

(56) References Cited

U.S. PATENT DOCUMENTS

| | | | |
|---|---|---|---|
| 4,819,135 A * | 4/1989 | Padilla et al. .................. | 362/473 |
| 5,337,225 A | 8/1994 | Brookman | |
| 5,544,027 A | 8/1996 | Orsano | |
| 5,559,681 A | 9/1996 | Duarte | |
| 5,667,290 A * | 9/1997 | Cioletti et al. ................ | 362/473 |
| 5,765,936 A * | 6/1998 | Walton et al. .................. | 362/473 |
| 5,823,653 A * | 10/1998 | Elam et al. ..................... | 362/473 |
| 5,836,673 A | 11/1998 | Lo | |
| 5,848,837 A | 12/1998 | Gustafson | |
| 5,857,273 A | 1/1999 | Rapisarda | |
| 5,927,845 A | 7/1999 | Gustafson et al. | |
| 5,934,792 A | 8/1999 | Camarota | |
| 6,186,645 B1 * | 2/2001 | Camarota ............... | 362/249.11 |
| 6,371,637 B1 | 4/2002 | Atchinson et al. | |
| 6,514,096 B1 | 2/2003 | Liu | |
| 6,601,971 B1 | 8/2003 | Ko | |
| 6,673,293 B1 | 1/2004 | Mistopoulos et al. | |
| 6,697,130 B2 | 2/2004 | Weindorf et al. | |
| 6,840,655 B2 | 1/2005 | Shen | |
| 6,846,094 B2 | 1/2005 | Luk | |
| 7,021,792 B2 | 4/2006 | Lin | |
| 7,034,230 B2 | 4/2006 | Fan | |
| 7,210,818 B2 | 5/2007 | Luk et al. | |

(Continued)

*Primary Examiner* — David J Makiya
(74) *Attorney, Agent, or Firm* — Porter Wright Morris & Arthur, LLP

(57) ABSTRACT

An integrally-formed single-piece flexible light strip includes a substrate populated with at least one LED light circuit. A clear flexible plastic housing is molded around the LED light circuit to completely encapsulate the light circuit. A flexible electrical cable and contoured strain relief for the electrical cable are also integrally formed as part of the light strip to maintain complete environmental and physical protection and eliminate any non-flexible portions of the light strip such as when a connector is used. The light strip is manufactured in a cost efficient manner, and is impervious to moisture penetration and highly resistant to physical damage, thereby allowing the light strip to be used in a variety of applications and environments. The shape of the illustrated light strip is specially designed for attachment to the round tubing of a bicycle frame. The light strip includes an electrical circuit allowing a reduction in the number of wires between the strip and its associated external control and power.

44 Claims, 16 Drawing Sheets

(56) References Cited

U.S. PATENT DOCUMENTS

| | | |
|---|---|---|
| 7,686,477 B2 | 3/2010 | Southard et al. |
| 7,798,685 B2 * | 9/2010 | Edmond et al. ............... 362/473 |
| 2003/0095404 A1 * | 5/2003 | Becks et al. ................. 362/185 |
| 2003/0168247 A1 | 9/2003 | Schreck et al. |
| 2003/0214809 A1 | 11/2003 | Wong |
| 2004/0223328 A1 * | 11/2004 | Lee et al. ..................... 362/249 |
| 2005/0018417 A1 | 1/2005 | Chien |
| 2006/0092647 A1 * | 5/2006 | Glasser ........................ 362/473 |
| 2007/0263385 A1 * | 11/2007 | Fan ............................... 362/252 |
| 2008/0067526 A1 | 3/2008 | Chew |
| 2008/0232103 A1 | 9/2008 | Nall et al. |
| 2012/0243245 A1 * | 9/2012 | Smith et al. .................. 362/473 |
| 2012/0243246 A1 * | 9/2012 | Waring ........................ 362/473 |
| 2012/0327647 A1 * | 12/2012 | Husong ........................ 362/220 |

\* cited by examiner

FIG. 1
FIG. 2
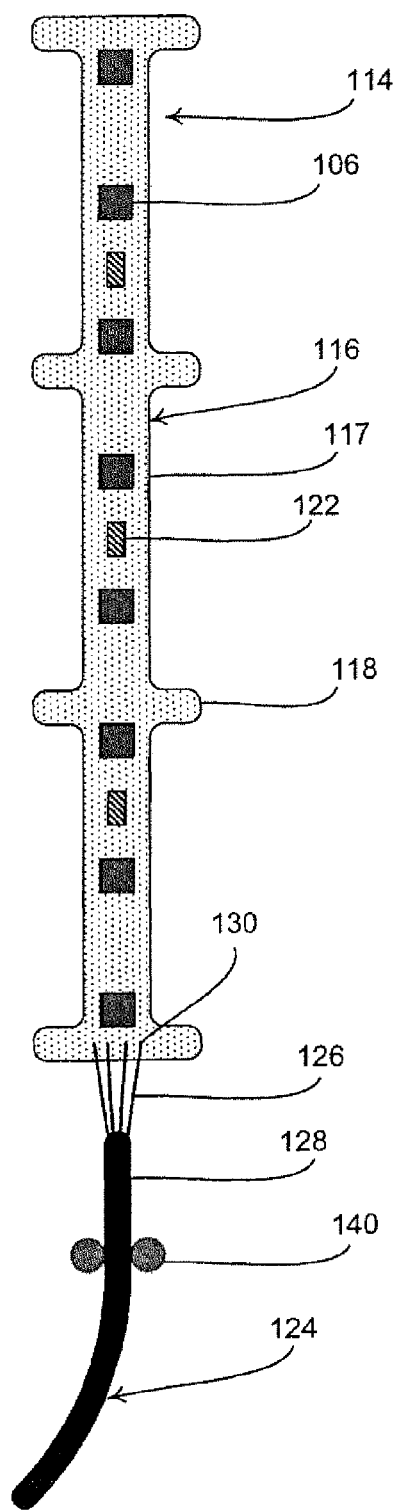
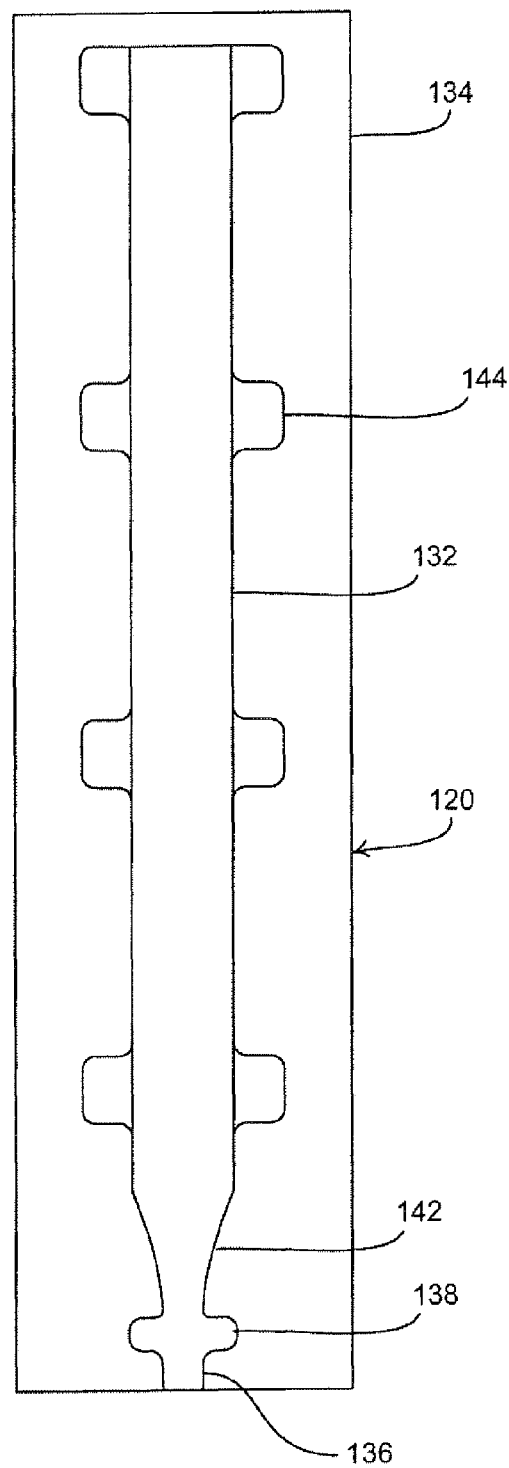

FIG. 3
FIG. 4
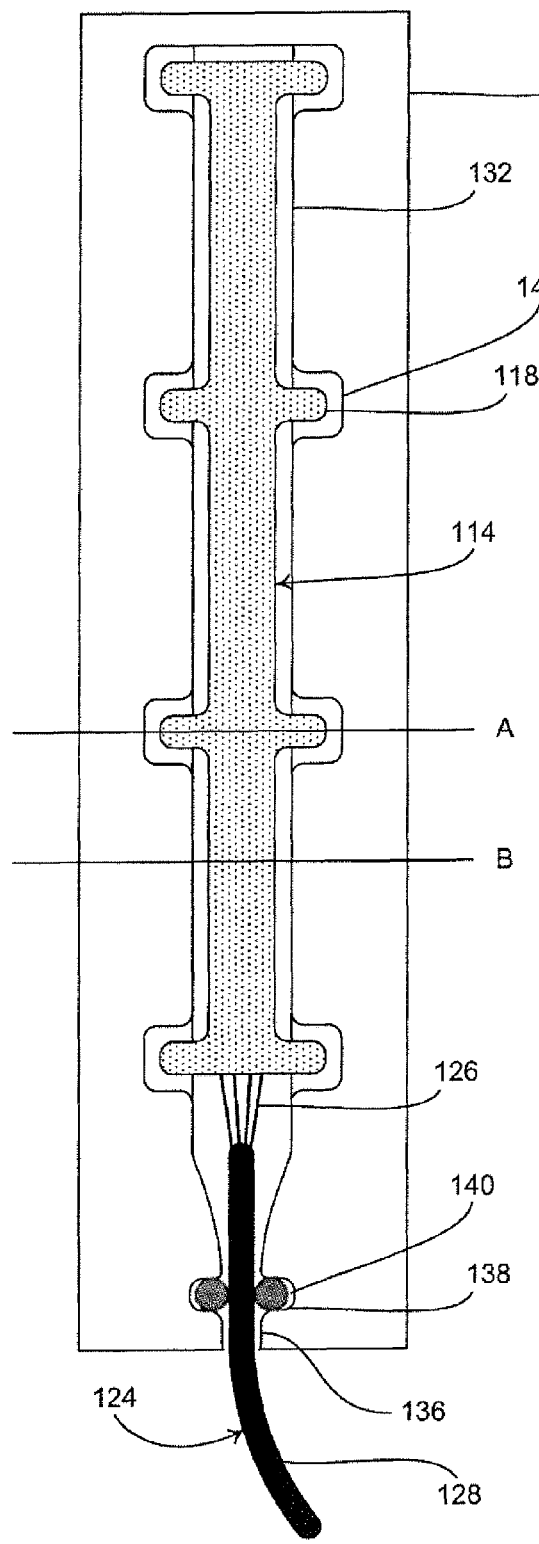
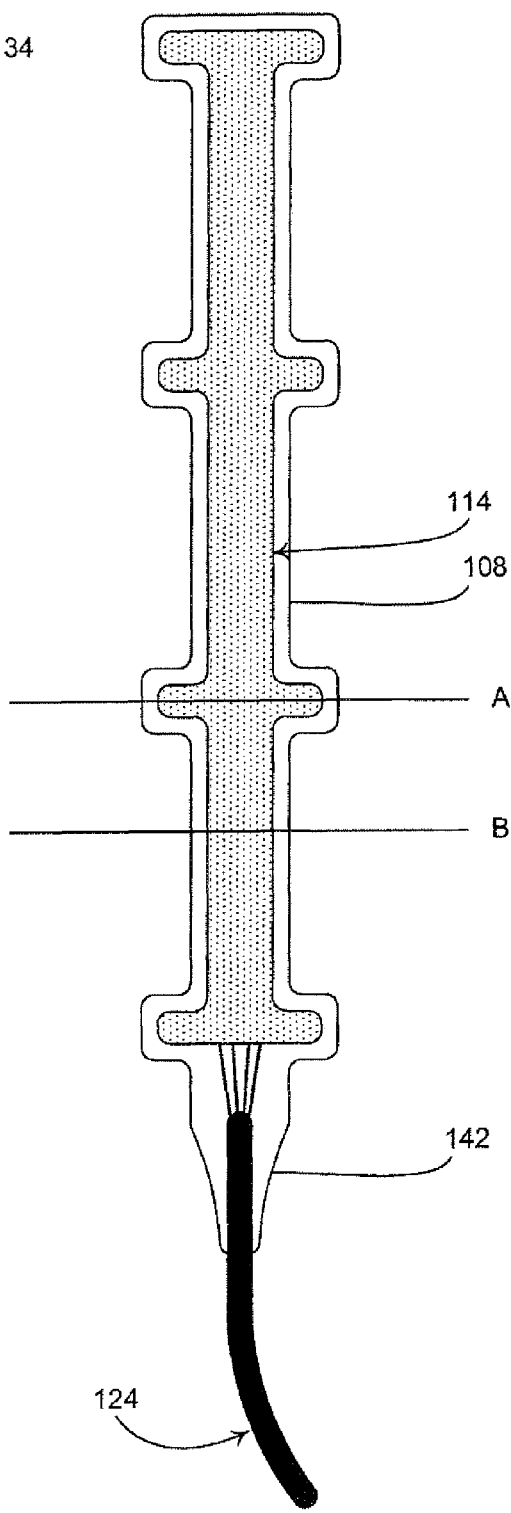

FIG. 5
FIG. 6
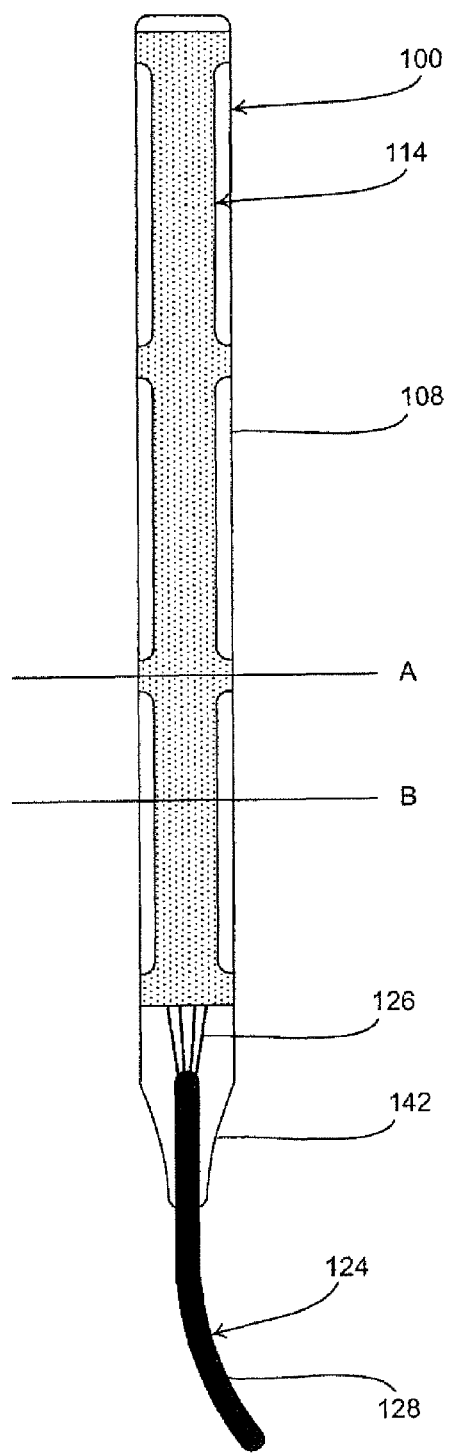
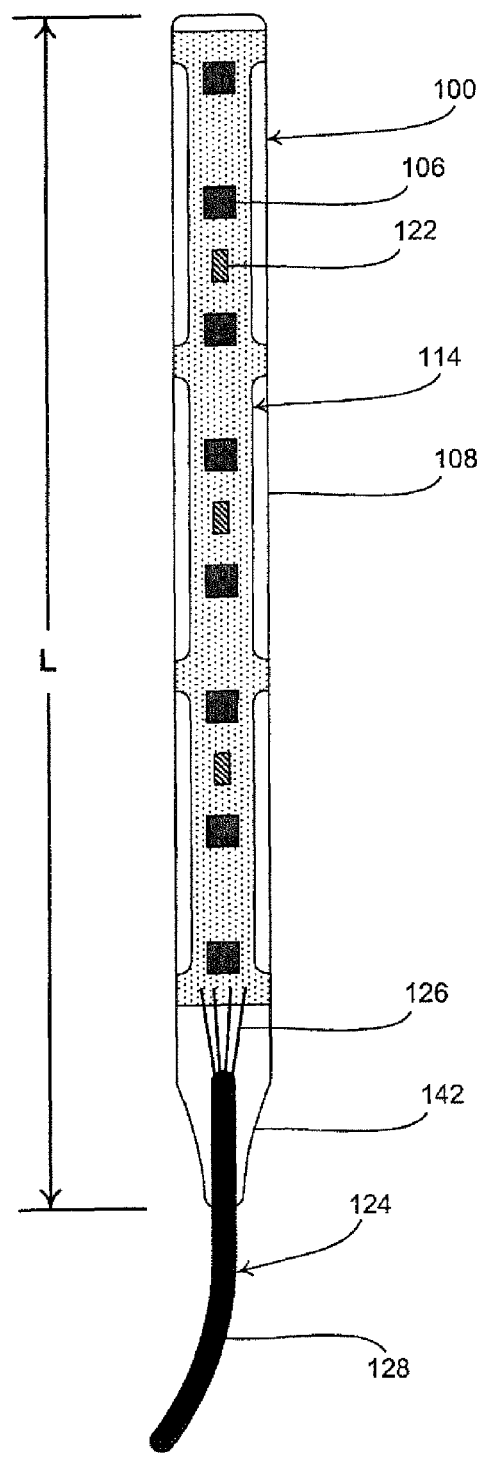

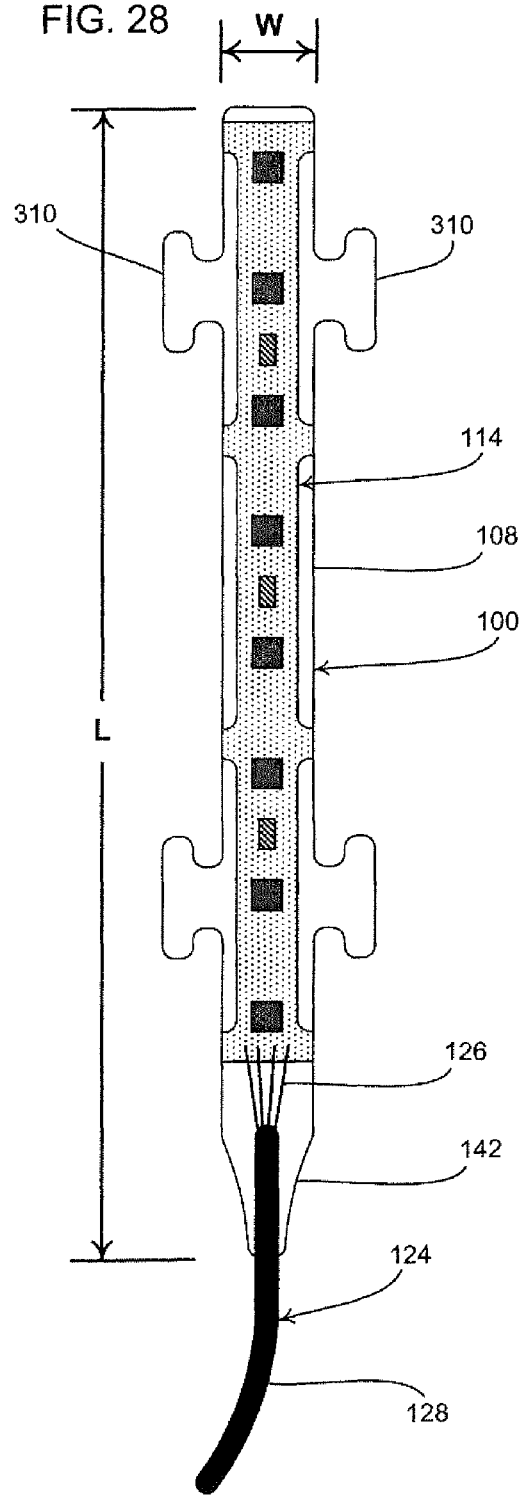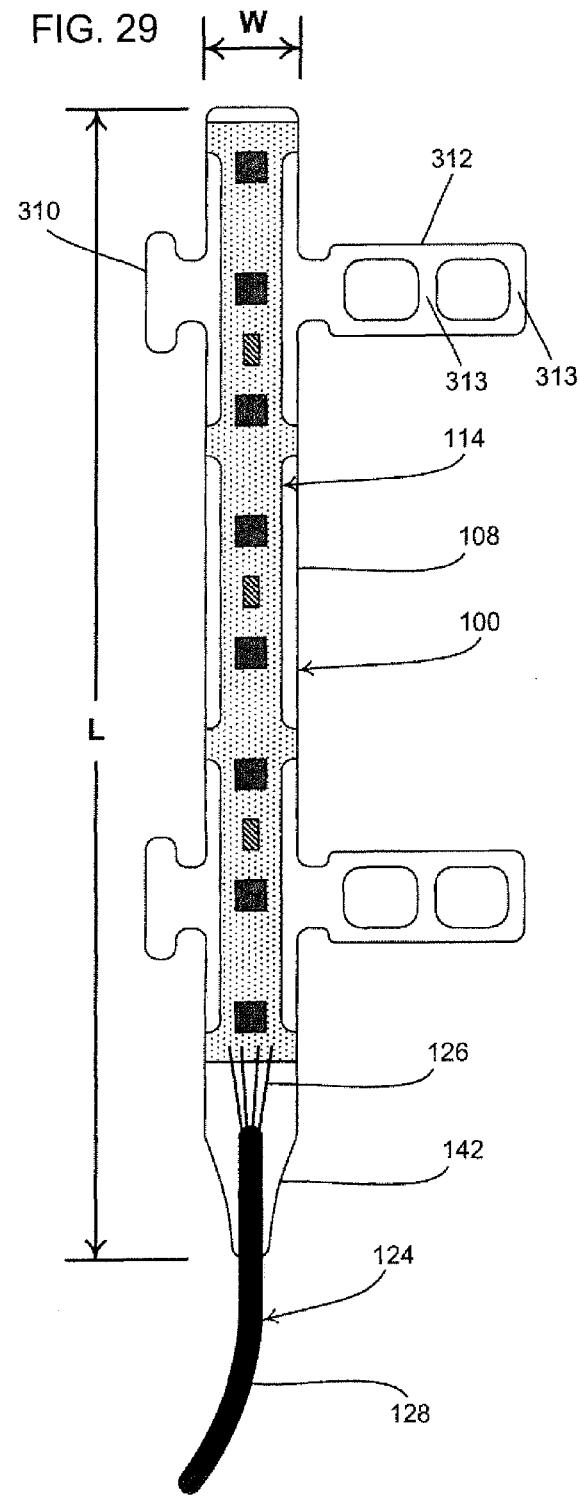

US 8,789,988 B2

FLEXIBLE LED LIGHT STRIP FOR A BICYCLE AND METHOD FOR MAKING THE SAME

CROSS-REFERENCE TO RELATED APPLICATIONS

Not Applicable

STATEMENT REGARDING FEDERALLY SPONSORED RESEARCH

Not Applicable

PARTIES TO A JOINT RESEARCH AGREEMENT

Not Applicable

REFERENCE TO APPENDIX

Not Applicable

FIELD OF THE INVENTION

The field of the present invention relates to flexible light strips and, more particularly, specific enhancements in shape and construction of flexible light strips and manufacturing methods for making the same.

BACKGROUND OF THE INVENTION

Light emitting diode (LED) light strips can provide markings in dimly lit environments. LED light strips are relatively inexpensive, easy to install, and exhibit long life when compared to similar bulb or lamp based markers. Many varieties of LED light strips and manufacturing methods are well known and widely available.

When using a LED light strip on a bicycle, it is imperative that the LED, and associated circuitry housed within the strip, is protected from damage due to loads and impact upon the strip and also from exposure to moisture ingress. However, many conventional LED light strips include circuitry housed within hollow tube-like sheathings which provide only minimal protection against mechanical damage to the circuitry due to excessive loads placed on the sheathings. For example see U.S. Pat. No. 6,846,094 entitled "Flexible LED Lighting Strip" and assigned to Altman Stage Lighting Co., Inc., the disclosure of which is expressly incorporated herein in its entirety by reference. Also, as the tube-like sheathings are hollow, the LED strips are typically susceptible to damage caused by moisture penetration. As a result, such LED light strips are often not desirable for outdoor lighting applications or other applications in which the LED strips are exposed to extreme weather conditions or abuse.

Another conventional light strip includes a multi-layer electroluminescent (EL) lamp configuration sealed through a conventional sheet or hard lamination process. In this hard lamination process, a top layer of protective film is either adhesively bonded or thermally fused to a bottom layer of protective film through the use of high temperatures and high pressure rollers to sandwich the EL lamp configuration between the layers. Such an EL light strip provides a more permanent type of protective sheathing than the above mentioned tube-like sheathing associated with other conventional EL light strips, and provides a more effective moisture barrier. However, moisture is often capable of penetrating into the interior of these two-piece EL light strips through the fused or bonded seal joining the two-piece housing, especially when the strips are used in outdoor applications, or after the bonded or fused seal connecting the two-piece housing weakens over time. In addition, the hard lamination process used to seal the EL lamp configuration is not desirable for LED circuitry, as LEDs are typically greater in height than the substantially flat layers forming the EL lamp configuration. High pressure rollers typically used to bond or fuse the two-piece housing could crush the protruding LEDs during formation of the strip. In addition, the high temperatures required for the bonding or fusing of the strip would subject the LEDs and associated circuitry to heat damage.

Commodity LED Light strips are also commonly manufactured using a two-part coating or encapsulation process. For example, a flexible circuit with LEDs is placed into a pre-extruded rubber trough. The trough is then filled with a liquid RTV compound that hardens into a flexible rubber. Just as with the EL lamps, the two layers of rubber can easily separate from each other or from the flexible circuit under physical stress, or do not effectively seal moisture.

Processes for effective and durable continuous extruded LED light strips have also been developed. For example, see U.S. Pat. No. 6,673,293 entitled "Automated System and Method for Manufacturing an LED Light Strip Having an Integrally Formed Connector" and assigned to Cooper Technology Services, LLC, the disclosure of which is expressly incorporated herein in its entirety by reference. The '293 patent discloses a continuous extrusion process which produces integrally formed single-piece encapsulated strips that have no internal voids, and thereby provide a high degree of protection against damage due to loads placed on the strips and are highly resistant to moisture ingress. This process provides an integrally formed LED light strip that includes fully encapsulated LED circuitry connected to a substrate that exhibits superior bonding characteristics with the extruded light strip housing, thereby providing a high degree of protection from moisture ingress and thereby increasing the functional life of the strip itself. Other examples of such extruded strips are disclosed in U.S. Pat. No. 5,927,845 entitled "Integrally Formed Linear Light Strip With Light Emitting Diodes" and assigned to StanTech, and in pending U.S. Pat. No. 5,848,837 entitled "Integrally Formed Linear Light Strip With Light Emitting Diodes" and assigned to StanTech, the disclosures of which are expressly incorporated herein in their entireties by reference.

Prior art LED light strips, including those disclosed by the '293 patent, do not effectively address durability, flex and environmental protection of an electrical connection at their end or ends. A key element of any light strip is that it is powered and controlled electrically from one or both ends. Many light strips such as those disclosed in the '094 patent are intended for room, stage or building-sized installations and provide a rigid electrical connector at the end of a long flexible light strip. In a comparatively small installation such as a bicycle, a rigid electrical connector at the end of the light strip may preclude a clean-looking, form-fitting installation since the electrical connector can't easily match the rest of the light strip in size, shape or flex. Furthermore, an electrical connector that meets high physical and environmental protection is generally expensive. The electrical connector is a common failure point in many commercially available light strips. Some other light strip designs such as those disclosed in the '293 patent do not entirely specify the electrical connector, providing only a portion of an electrical connector, an area where an electrical connector can be attached by a professional installer, or leaving electrical connection entirely up to an installer. This may be suitable for an architectural application, but not for a high volume consumer product such as a flexible light strip for bicycles where ease of installation and use is important. Accordingly, there is a need in the art for an improved LED light Strip.

SUMMARY OF THE INVENTION

The present invention provides an encapsulated flexible LED light strip and a process for making the same that overcomes at least one of the above-noted problems of the prior art. Disclosed is an encapsulated flexible LED light strip comprising a flexible substrate including an LED light circuit having at least three spaced-apart LED lights, a flexible plastic housing encapsulating the LED light circuit, and at least one flexible electrical cable extending through the flexible plastic housing to the LED light circuit. The flexible plastic housing has a length extending between opposed ends, a width extending between opposed lateral sides, and a thickness extending between opposed front and rear sides. The encapsulated flexible LED light strip has a minimum flexibility of the length such that when the length is shorter than 200 mm every 80 mm section of the length can bend over an arc of 20 degrees and when the length is 200 mm or longer every 150 mm section of the length can bend over an arc of 20 degrees. The LED lights are at the front side. The length is in the range of 80 mm to 2.0 m. The length to the width has a ratio of at least 8:1. The rear side includes a groove having a V-shape in cross-section and extending between the ends.

Also disclosed is an encapsulated flexible LED light strip comprising a flexible substrate including an LED light circuit having at least three spaced-apart LED lights, a flexible plastic housing encapsulating the LED light circuit, and at least one flexible electrical cable extending through the flexible plastic housing to the LED light circuit. The flexible plastic housing has a length extending between opposed ends, a width extending between opposed lateral sides, and a thickness extending between opposed front and rear sides. The encapsulated flexible LED light strip has a minimum flexibility of the length such that when the length is shorter than 200 mm every 80 mm section of the length can bend over an arc of 20 degrees and when the length is 200 mm or longer every 150 mm section of the length can bend over an arc of 20 degrees. The length is in the range of 80 mm to 2.0 m. The length to the width has a ratio of at least 8:1. The flexible plastic housing forms a contoured strain relief for the at least one flexible electrical cable.

Also disclosed is a method of manufacturing an encapsulated flexible LED light strip comprising the steps of placing a flexible substrate including an LED light circuit having at least three spaced-apart LED lights into a cavity mold such that support tabs of the LED light circuit are located on ledges of the cavity mold to support the LED light circuit and fix the position of the LED light circuit in three dimensions within the cavity mold, extending at least one flexible electrical cable from the LED light circuit and out of the cavity mold, and supplying a flexible plastic material into the cavity to mold a flexible housing about the LED light circuit. The molded housing fully encapsulates the LED light circuit on all sides to form a seamless substantially voidless barrier. The molded flexible housing with the flexible substrate therein is then removed from the cavity mold.

Also disclosed is a method of using an encapsulated flexible LED light strip comprising the steps of obtaining an encapsulated flexible LED light strip including a groove having a V-shape in cross-section and extending between the ends, and engaging the encapsulated flexible LED light strip with a tube of a bicycle frame with the tube located in the groove of the encapsulated flexible LED light strip. The encapsulated flexible LED light strip is then secured to the tube.

Also disclosed is an encapsulated flexible LED light strip comprising a flexible substrate including an LED light circuit having at least three spaced-apart LED lights, a flexible plastic housing encapsulating the LED light circuit, and at least one flexible electrical cable extending from the LED light circuit and through the flexible plastic housing. The flexible plastic housing has a length extending between opposed ends, a width extending between opposed lateral sides, and a thickness extending between front and rear sides. The encapsulated flexible LED light strip has a minimum flexibility of the length such that when the length is shorter than 200 mm every 80 mm section of the length can bend over an arc of 20 degrees and when the length is 200 mm or longer every 150 mm section of the length can bend over an arc of 20 degrees. The length is in the range of 80 mm to 2.0 m. The length to the width has a ratio of at least 8:1. The LED light circuit is configured so that the LED lights are individually controllable. The LED light circuit located within the encapsulated flexible LED light strip is configured to internally generate a latch signal based upon an externally supplied clock and serial data signal. The flexible electrical cable connecting the encapsulated strip contains three to six flexible insulated electrical wires.

Also disclosed is an LED light system for a bicycle comprising set of two to eight encapsulated flexible LED light strips and an external controller and power source electrically connected to each of the two to eight encapsulated flexible LED light strips. Each of the light strips comprise a flexible substrate including an LED light circuit having at least three spaced-apart LED lights, a flexible plastic housing encapsulating the LED light circuit, and at least one flexible electrical cable extending from the LED light circuit and through the flexible plastic housing to the external controller and power source. The flexible plastic housing has a length extending between opposed ends, a width extending between opposed lateral sides, and a thickness extending between front and rear sides. The encapsulated flexible LED light strip has a minimum flexibility of the length such that when the length is shorter than 200 mm every 80 mm section of the length can bend over an arc of 20 degrees and when the length is 200 mm or longer every 150 mm section of the length can bend over an arc of 20 degrees. The length is in the range of 80 mm to 2.0 m. The length to the width has a ratio of at least 8:1. The set of encapsulated flexible LED light strips can provide a coordinated display when the set of encapsulated flexible LED light strips is mounted on the bicycle.

From the foregoing disclosure and the following more detailed description of various preferred embodiments it will be apparent to those skilled in the art that the present invention provides a significant advance in the technology and art of flexible LED light strips. Particularly significant in this regard is the potential the invention affords for providing an easy to install, durable, reliable, and relatively inexpensive flexible LED light strip. Additional features and advantages of various preferred embodiments will be better understood in view of the detailed description provided below.

BRIEF DESCRIPTION OF THE DRAWINGS

These and further features of the present invention will be apparent with reference to the following description and drawings, wherein:

FIG. 1 is a top view of a LED light strip prior to molding an outer protective housing.

FIG. 2 is top view of a primary mold cavity for molding the outer protective housing on the LED light strip of FIG. 1.

FIG. 3 is a top view of the LED light strip of FIG. 1 located in the primary mold cavity of FIG. 2 with the top or component side of the LED light strip facing down into the primary mold cavity in order to mold the outer protective housing of the LED light strip.

FIG. 4 is a bottom view of the LED light strip after molding the outer protective housing as removed from the mold.

FIG. 5 is a bottom view of the encapsulated LED light strip assembly after trimming to form a continuous outer profile.

FIG. 6 is a bottom view of the encapsulated LED light strip assembly after trimming.

FIG. 28 is view similar to FIG. 6 but showing an alternative encapsulated LED light strip assembly which has integrally molded mounting tabs.

FIG. 29 is view similar to FIG. 6 but showing an alternative encapsulated LED light strip assembly which has integrally molded mounting tabs and straps.

Figure 7:
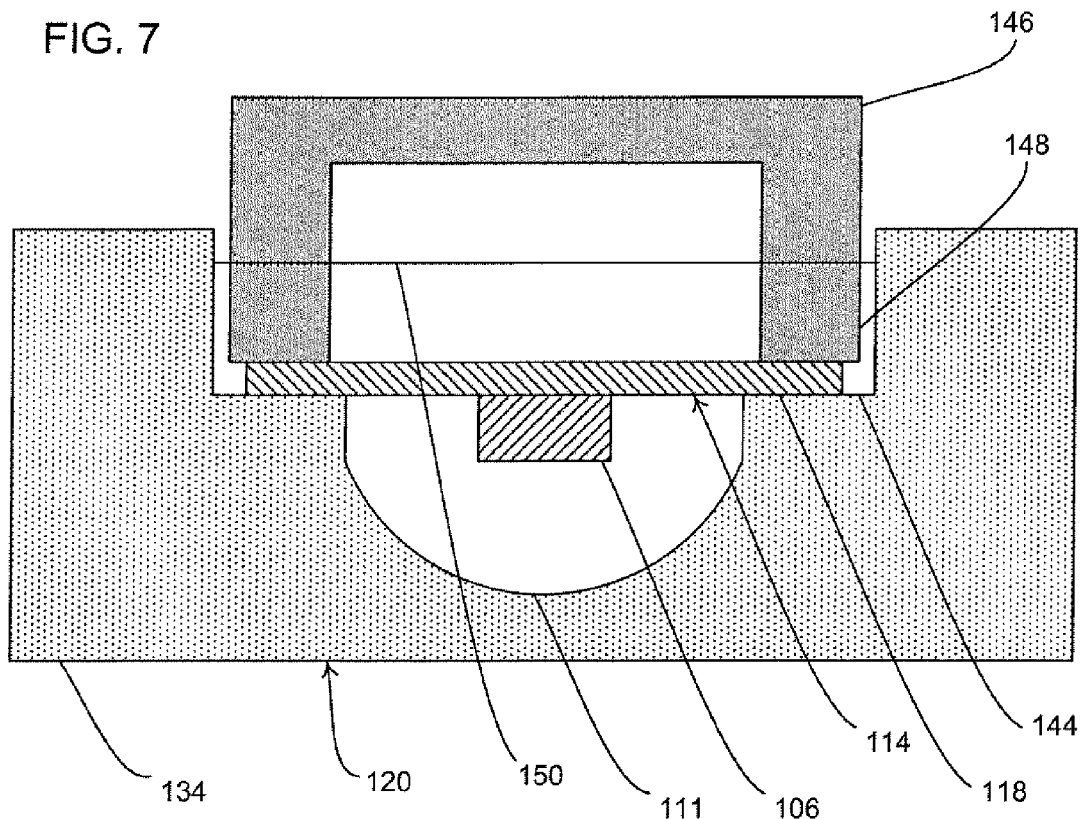
FIG. 7 is a cross-sectional view taken along line A of FIG. 3.

It should be understood that the appended drawings are not necessarily to scale, presenting a somewhat simplified representation of various preferred features illustrative of the basic principles of the invention. The specific design features of the flexible LED light strips as disclosed herein, including, for example, specific dimensions, orientations, and shapes will be determined in part by the particular intended wheels upon which the apparatus is designed to attach. Certain features of the illustrated embodiments have been enlarged or distorted relative to others to facilitate visualization and clear understanding. In particular, thin features may be thickened, for example, for clarity or illustration. All references to direction and position, unless otherwise indicated, refer to the orientation of the components illustrated in the drawings.

DETAILED DESCRIPTION OF CERTAIN PREFERRED EMBODIMENTS

It will be apparent to those skilled in the art, that is, to those who have knowledge or experience in this area of technology, that many uses and design variations are possible for the encapsulated flexible LED light strips disclosed herein. The following detailed discussion of various alternative and preferred embodiments will illustrate the general principles of the invention with reference to specific embodiments suitable for use on a bicycle. Other embodiments suitable for other applications will be apparent to those skilled in the art given the benefit of this disclosure.

Figure 20:
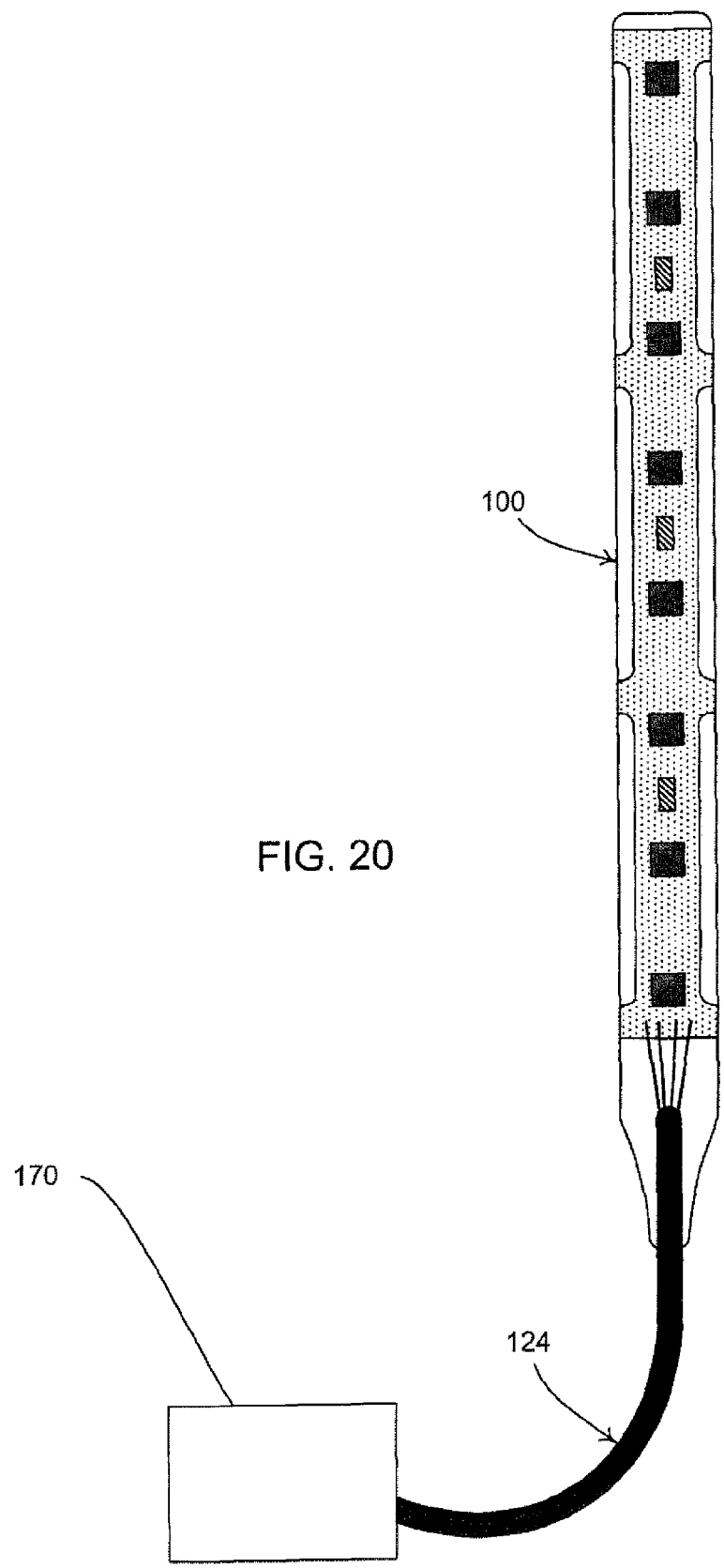
FIG. 20 is a diagrammatic view of the flexible LED light strip of FIGS. 1 to 19 electrically connected to an external master controller and power source.

FIG. 20 illustrates an encapsulated flexible LED light strip 100 according to the present invention. The illustrated encapsulated flexible LED light strip 100 includes a flexible substrate or LED light strip 114 including an LED light circuit 104 having a plurality of LED lights 106 and a clear flexible plastic material fully encapsulating the LED light circuit 104 on all sides to form a seamless substantially voidless flexible plastic covering or housing 108. The term "plastic" is used in the specification and in the claims to mean all suitable plastics, elastomerics, organic rubbers, synthetic rubbers, and the like. A flexible electrical cable 110 extends through the flexible housing 112 to the LED light circuit 104 at one end of the encapsulated flexible LED light strip 100 to connect an external master controller and power source 112. It is noted however, that one or more flexible electrical cables 110 can be provided at one end or both of the ends. The term "electrical cable" is used in this specification and in the claims to mean a bundle of two or more insulated electrical wires. The term "wires" and "electrical wires" are used in this specification and in the claims to means "one electrical conductor. The electrical cable 110 can be replaced with one or more flexible electrical wires, electrical connectors, electrical terminals, or any other suitable electrical connection means in applications where a lesser degree of flexibility is acceptable. It is noted that the illustrated encapsulated flexible LED light strip 100 is electrically connected to the external controller and power source 112 with the flexible electrical cable 110 but the illustrated encapsulated flexible LED light strip 100 is not mechanically or structurally connected to the external controller and power source 112 other than by a common structure to which both are secured such as a bicycle wheel or frame as described in more detail hereinafter and the flexible electrical cable 110.

FIG. 1 shows a component or front side of an assembled flexible LED light strip 114 before over-molding the flexible housing 108 thereon. At this stage of assembly, the assembled flexible LED light strip 114 has full electrical functionality. The illustrated flexible LED light strip 114 comprises a flexible circuit board 116. The flexible circuit board 116 can comprise a Polyimide plastic with copper circuitry traces (known commonly as a flexible printed circuit or "FPC") or any other suitable materials. The illustrated flexible circuit board 116 is elongate having a length substantially greater than its width. The illustrated circuit board 116 is substantially planar and has a generally rectangular-shaped central portion 117 and a plurality of laterally-extending support tabs 118 at both lateral sides of the central portion 117 and spaced-apart along the length of the circuit board 116. The illustrated circuit board 116 has four of the support tabs 118 at each side of the central portion 117 but any other suitable quantity can alternatively be utilized. The support tabs 118 are sized and shaped to cooperate with a cavity mold 120 for supporting the assembled flexible LED light strip 114 within the cavity mold 120 while molding the flexible housing 108 as described in more detail hereinafter.

Figure 18:
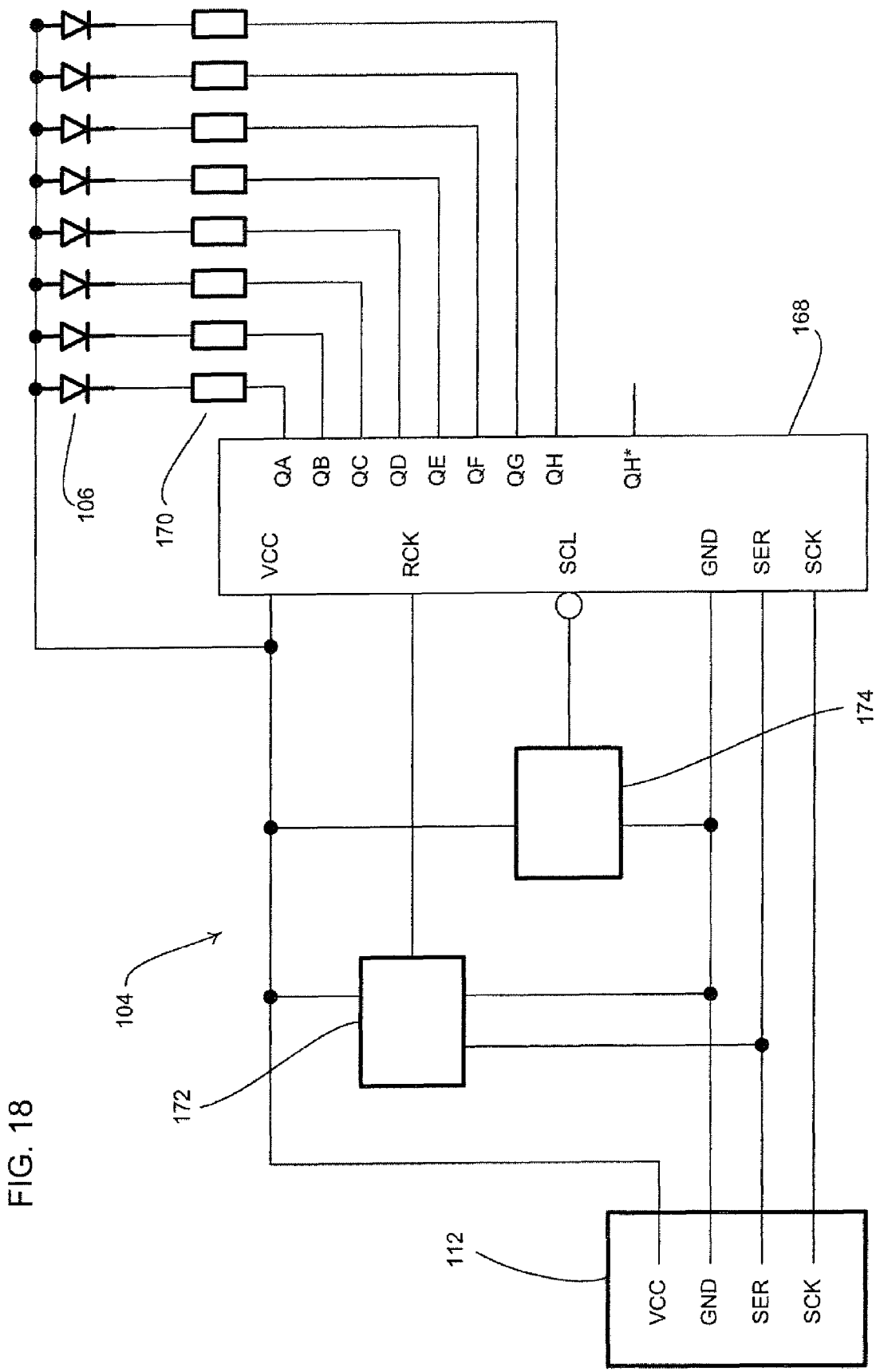
FIG. 18 is a schematic view of the flexible LED light strip of FIGS. 1 to 17.
Figure 19:
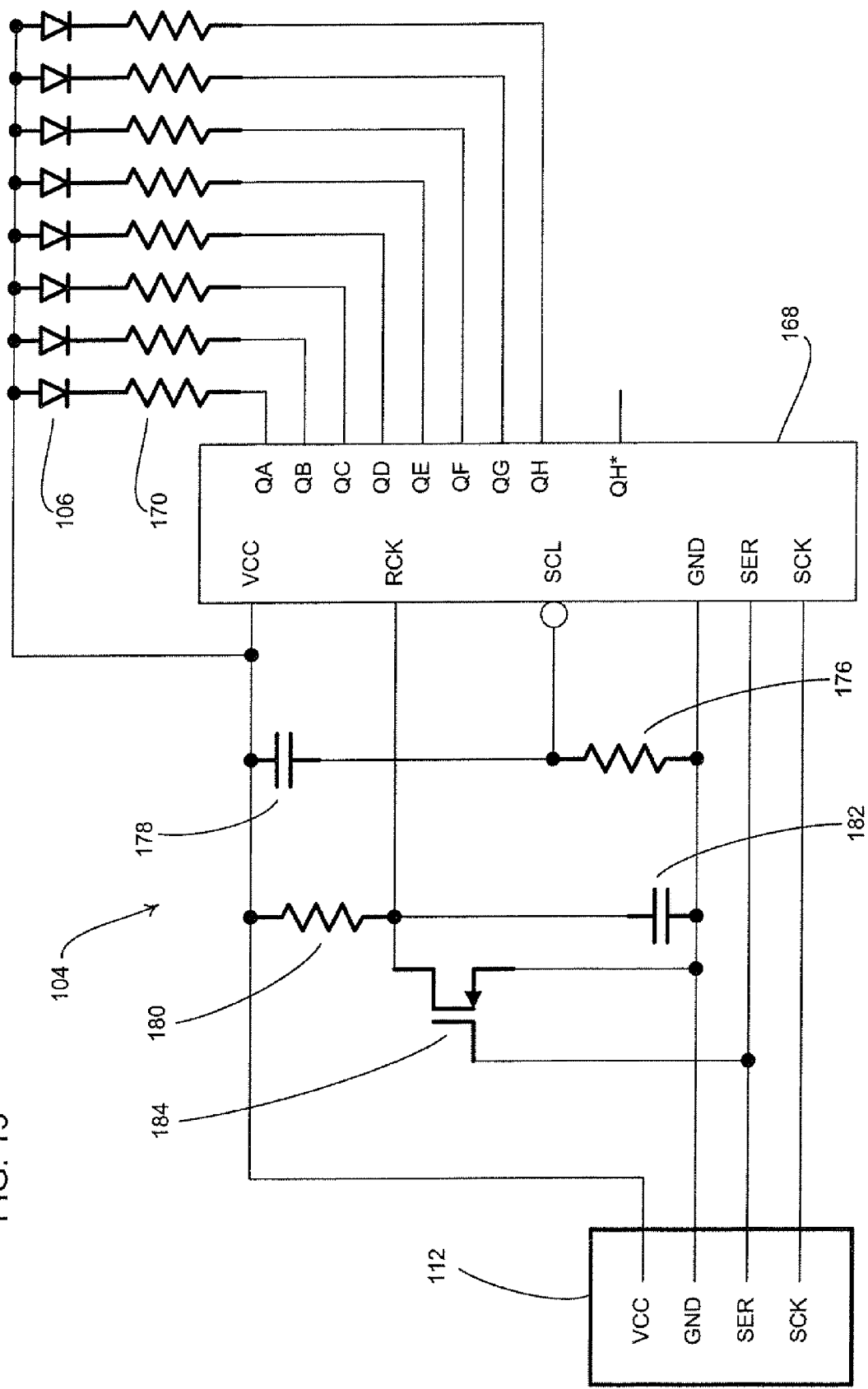
FIG. 19 is a schematic view similar to FIG. 18 but showing circuits to generate enable and latch signals.

The illustrated LED light circuit 104 includes the LED lights 106 and other electronic components 122 for desired operation of the LED lights 106 as described in more detail hereinafter. The illustrated LED lights 106 and other electronic components 122 are electrically connected by electrical wires in the form of copper circuit traces located on both sides of the central portion 117 of the flexible circuit board 116. That is, located everywhere except for the tabs 118. It is noted however that any other suitable configuration can be utilized for electrically connecting the LED lights 106 and the other electronic components 122 such as, for example, other types of circuit traces. The illustrated electronic components 122 and the LED lights 106 are mounted along the length of the central portion 117 of the flexible circuit board 116 in a linear array at only the top side of the flexible circuit board 116. The illustrated support tabs 118 of the flexible circuit board 116 are free of electronic components 122 and electrical connections such as cables, wires, and the like so that they do not interfere with operation and removal of the support tabs 118. It is noted that other any suitable configuration can alternatively be utilized depending on the desired use. The use of removable support tabs allow the flexible LED light strip 114 to be positioned accurately in three dimensions within the mold, and easily removed after molding the housing 108. The illustrated LED light circuit 104 includes eight equally spaced apart LED lights 106 arranged in a linear array but any other suitable quantity of LED lights 106 from three to two-hundred and sixty can alternatively be utilized. The illustrated LED lights 106 are full color RGB LEDs but any other suitable type of LED lights 106 can alternatively be utilized. The other internal electronic components can be of any suitable type depending on the configuration of the encapsulated flexible LED light strip 100. For example, the LED lights 106 can be individually controllable or not individually controllable. As discussed hereinafter, FIGS. 18 and 19 illustrate exemplary circuits where the LED lights 106 are individually controllable.

The illustrated flexible electrical cable 110 is a flexible electrical power and data cable 124 having four flexible individually insulated electrical wires 126 and a flexible outer covering or insulation layer 128. The illustrated electrical power and data cable 124 is a four conductor, 24 gauge copper cable with PVC plastic insulation but any other suitable cable can alternatively be utilized. For example, the cable 124 can alternatively have one or more electrical wires 126 depending on whether the LED lights 106 are individually addressable, that is, individually controllable, among other factors. The flexible electric wires 126 extend from the LED light circuit 104 and through the flexible housing 108 to the external master controller and power source 112. Each of the illustrated four flexible electrical wires 126 is connected to a connection point 130 provided at the end of the flexible circuit board 116 with a non separable connection and thus is not removable without destroying the flexible housing 108 once manufacturing of the encapsulated flexible LED light strip 100 is complete. The other end of each of the illustrated four flexible electrical wires 126 is directly connected to the external master controller and power source 112 but can alternatively be removably connected with an electrical connector or the like.

The illustrated flexible housing 108 is molded over the assembled flexible LED light strip 114. Any suitable molding process can be used which utilizes a mold 120 having a mold cavity 132. The cavity mold 120 can be, for example, a single-sided mold, a double-sided mold, an unpressurized mold, a pressurized mold, or any other suitable type of mold having a cavity. FIG. 2 illustrates a primary mold substrate 134 of a single sided cavity mold 120. The primary mold substrate 134 has a cavity 132 sized and shaped for receiving the assembled flexible LED light strip 114 therein and molding the flexible housing 108 thereabout to a desired shape. The illustrated cavity 132 is open on its upper side and has an open passage 136 at one end for passage of the cable 124 therethrough. The illustrated passage 136 includes an end seal area 138 for receiving an O-ring seal 140 located on the cable 124 for sealing the passage 136 to prevent the release of molding material through the passage 136 during molding of the flexible housing 108. Other types of seals can alternatively be used such as, for example, a compression seal in which two sides of the mold cavity 132 are compressed fully around the flexible cable 124. The cavity 132 is also shaped to form an integral tapered strain relief 142 for protecting the flexible cable 124. The illustrated strain relief 142 is generally frusto-conically shaped having a reducing diameter in the outward direction but any other suitable shape can alternatively be utilized. The strain relief 142 can be provided with ridges, slots or the like if desired to increase flexibility. The illustrated strain-relief 142 has a length of about 20 mm, tapering from a strip-end width of about 12 mm to the cable-end width of about 4 mm. A plurality of horizontal and upward-facing support ledges 144 are provided for the support tabs 118 to support the assembled flexible LED light strip 114 in spaced relationship to the walls of the cavity for molding the flexible housing 108.

Figure 8:
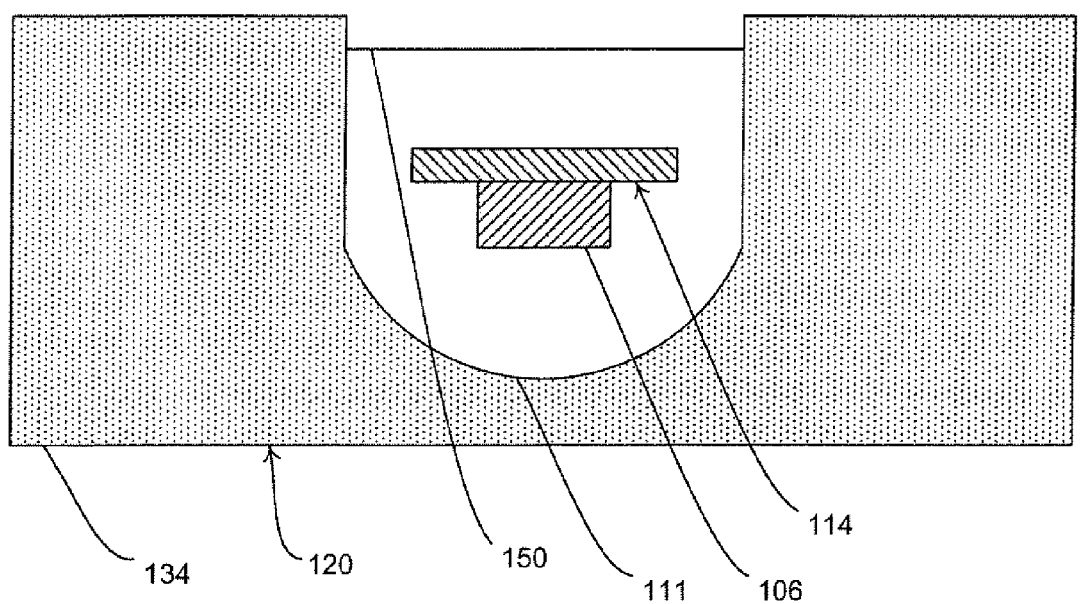
FIG. 8 is a cross-sectional view taken along line B of FIG. 3.

As best shown in FIGS. 3, 7, and 8, the assembled flexible LED light strip 114 is placed into the cavity 132 prior to the start of molding. The illustrated assembled flexible LED light strip 114 is placed into the cavity 132 with its component side facing down, although other mold cavity shapes may be alternatively designed where the component side of the assembled flexible LED light strip 114 is facing up during molding. The support tabs 118 of the circuit board 116 rest on the support ledges 144 of the mold 120. The rubber o-ring seal 140 fits tightly into the end seal area 138, so that after the mold cavity 132 is filled with fluid it will not leak out around the cable 124.

The illustrated single-sided mold 120 creates a flexible housing 108 with a desired profile on the side facing the cavity 132 (the component or front side in the illustrated embodiment) and a flat profile on the other side facing up or away from the bottom of the cavity 132 (the non-component or rear side in the illustrated embodiment). The illustrated cavity 132 is shaped to form a curved or arcuate profile in cross section and extend along the length on the side facing the cavity 132 but it can alternatively be shaped to provide any other desired shape. The curved shape can be designed to form a lens which causes light from the LED lights 106 to be dispersed across a desired field such as, for example, dispersing the light across a 180-degree view for visibility from a wide area. A secondary mold substrate 146 of the illustrated mold 130 engages the support tabs 118 to hold the assembled flexible LED light strip 114 in its desired position within the cavity 132 but is not in contact with the molding material except at pinning legs 148 that cooperate with the mold cavity support ledges 144 which are located in notches to fix the flexible strip assembly in all three directions within the mold cavity 132. The assembled flexible LED light strip 114 is constrained in the mold cavity 132 against movement so that mold material will entirely surround the assembled flexible LED light strip 114 on all sides except at the outer portions of the support tabs 118.

The liquid molding material is introduced to the mold cavity 132 up to a fill line 150, and is hardened using any of several well known methods. The molding material is preferably a clear flexible plastic or elastomeric material such as, for example, a high strength, high adhesion, clear 2-part polyurethane material which cures to a hardness of about 80 on the Shore-A scale. It is noted however, any other suitable encapsulation material can be used. Gravity causes the liquid molding material to fill the cavity 132 entirely about the assembled flexible LED light strip 114 and form a flat surface at the fill line 150. The flat back side of the flexible housing 108 is suitable for attachment to surfaces on bicycles or other items which are relatively flat along the width of the LED light strip 114 but may be curved along the length of the LED light strip 114. While the illustrated molding process is an unpressurized process, it is noted that a pressurized or injection molding process can alternatively be utilized. It is also noted that any other suitable molding process can alternatively be utilized which can form the non uniform shape of the flexible housing 108.

Figure 9:
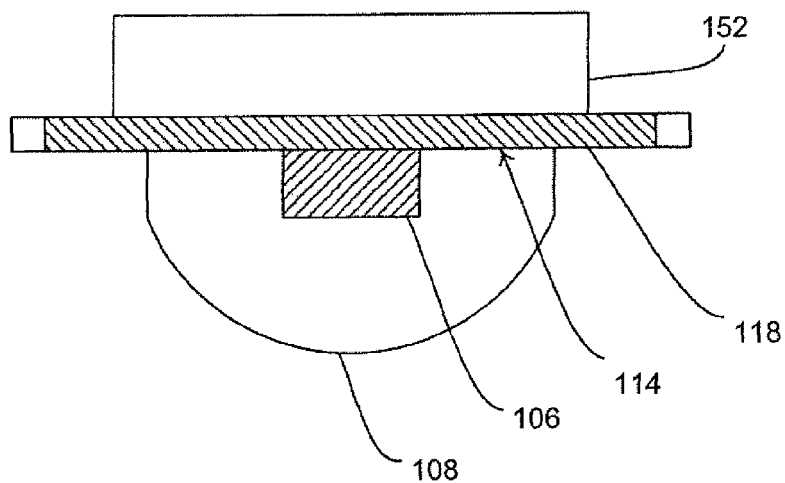
FIG. 9 is a cross-sectional view taken along line A of FIG. 4.
Figure 10:
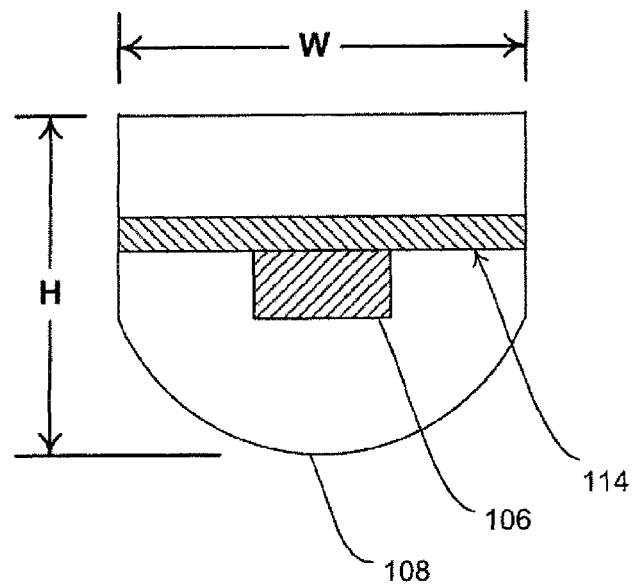
FIG. 10 is a cross-sectional view taken along line A of FIG. 5.
Figure 11:
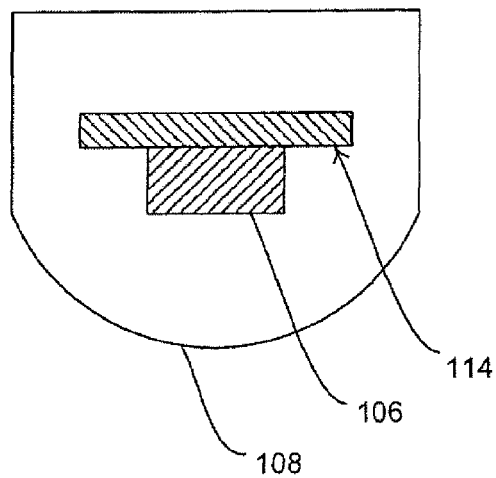
FIG. 11 is a cross-sectional view taken along line B of FIGS. 4 and 5.

FIGS. 4 and 9 show the encapsulated flexible LED light strip 100 after it is removed from the mold 120 and the O-ring seal 140 has been removed from the cable 124. After removing the encapsulated flexible LED light strip 100 from the mold 120, the majority of the support tabs 118 and excess molded plastic material 152 in the area of the support tabs 118 is removed. The support tabs 118 and excess molded plastic material 152 can be trimmed in any suitable manner such as, for example, a knife, saw, or the like.

FIGS. 5, 6, 10, and 11 show the finished encapsulated flexible LED light strip 100. The support tabs 118 have been substantially cut off or trimmed so that both of the lateral sides of the encapsulated flexible LED light strip 100 are substantially planar and have a substantially straight continuous profile. Encapsulated in this manner, the assembled flexible LED light strip 114 is fully encapsulated by the flexible housing 108 on all sides except the cut edges of the support tabs 118 along the lateral sides of the encapsulated flexible LED light strip 100. It is noted however, that the LED light circuit 104 and all electronic components 106, 122 are fully encapsulated by the flexible housing 108 on all sides. The encapsulated flexible LED light strip 100 is also continuously flexible along its entire length L including the entire flexible electrical cable 110 to the external power and/or control 112 and including a contoured strain-relief 142 for the connection cable 124. By molding the flexible housing 108, the assembled flexible LED light strip 114 including the flexible electrical cable 110 can be fully encapsulated in a monolithic solid plastic or elastomer in a single step, achieving maximum durability and environmental protection with the smallest (thin & narrow) possible strip size. The disclosed molding method also provides the ability to customize the profile of the strip 100 differently along its length L, most importantly to (1) allow a tapered strain relief 142 at the flexible electrical cable 110, (2) allow a larger area for circuitry and components over a small length of the strip 100 as needed, (3) allow full encapsulation of the flexible circuit in a single molding step with a strong, durable, flexible, clear material, and (4) allow creation of a LED light strip which is bendable and durable over its entire length including the connection to a power and data cable and the power and data cable itself.

The illustrated encapsulated flexible LED light strip 100 is specifically designed for use with bicycles but can be used in any other suitable applications. The illustrated flexible housing 108 of the encapsulated flexible LED light strip 100 has a length L of about 200 mm but it can have a length L between 80 mm and 2.0 m. The illustrated flexible housing 108 of the encapsulated flexible LED light strip 100 has a width W of about 12 mm but it can have a width W between 4 mm and 20 mm. The ratio between the length L and the width W of the encapsulated flexible LED light strip 100 is at least 8:1. The illustrated flexible housing 108 of the encapsulated flexible LED light strip 100 has a height H of about 8 mm but it can have a height H between 2 mm and 20 mm. It is noted that integrated mounting straps or other mechanical connections and the like which are not related to the electrical function of the LED light strip can be utilized but are not part of the housing 108 and thus do not increase the size of the flexible housing 108 within the meaning the terms "length," "width," and "height" of the housing as used in this specification and claims.

FIG. 28 shows an encapsulated flexible LED light strip 100 with integrated pairs of mounting tabs 310 integrally molded with the housing 108 to form a one-piece component. The illustrated tabs 310 are sized and shaped so that a rubber band or the like can be securely looped around the tab 310. Thus a common rubber band can be looped around a pair of the mounting tabs 310 and a tube to secure the encapsulated flexible LED light strip 100 to the tube. This type of mount allows for quick and easy removal and reattachment of the encapsulated flexible LED light strip 100 to a tube. Different sizes of rubber bands can be used as suitable for different diameters of tubing.

FIG. 29 shows an encapsulated flexible LED light strip 100 with integrated mounting tabs 310 and straps 312 integrally molded with the housing 108 to form a one-piece component. The illustrated mounting strap 312 forms a loop shape with two crossbars 313 that can be stretched around a tube and hooked onto the matching mounting tab 310. When a suitable flexible molding material is used for the housing 108, the mounting strip will also be suitably stretchy and able to securely mount the strip 100 to a wide range of tube diameters. The number of crossbars 313 can be one or more, the number used depending on the range of tubing sizes that will fit and the amount of stretch of the strap 312. Different overall lengths of the straps 312 can be used as suitable for different diameters of tubing. It is noted that any other suitable integrated mounting straps and/or tabs can alternatively be utilized.

The illustrated flexible housing 108 of the encapsulated flexible LED light strip 100 is generally bendable (i.e. with no significant un-bendable portions) in at least one axis of its length L. For LED light strips 100 with a length L shorter than 200 mm every 80 mm portion of its length L can bend over an arc of 20 degrees, and more desirably every 20 mm portion of its length L can bend over an arc of 20 degrees. For LED light strips 100 with a length L of 200 mm or longer every 150 mm portion of its length L can bend over an arc of 20 degrees, and more desirably every 20 mm portion of its length L can bend over an arc of 20 degrees. It is noted that the flexible housing 108 can be more or less bendable depending on its width W, height H, and stiffness as suitable for any particular application.

Figure 12:
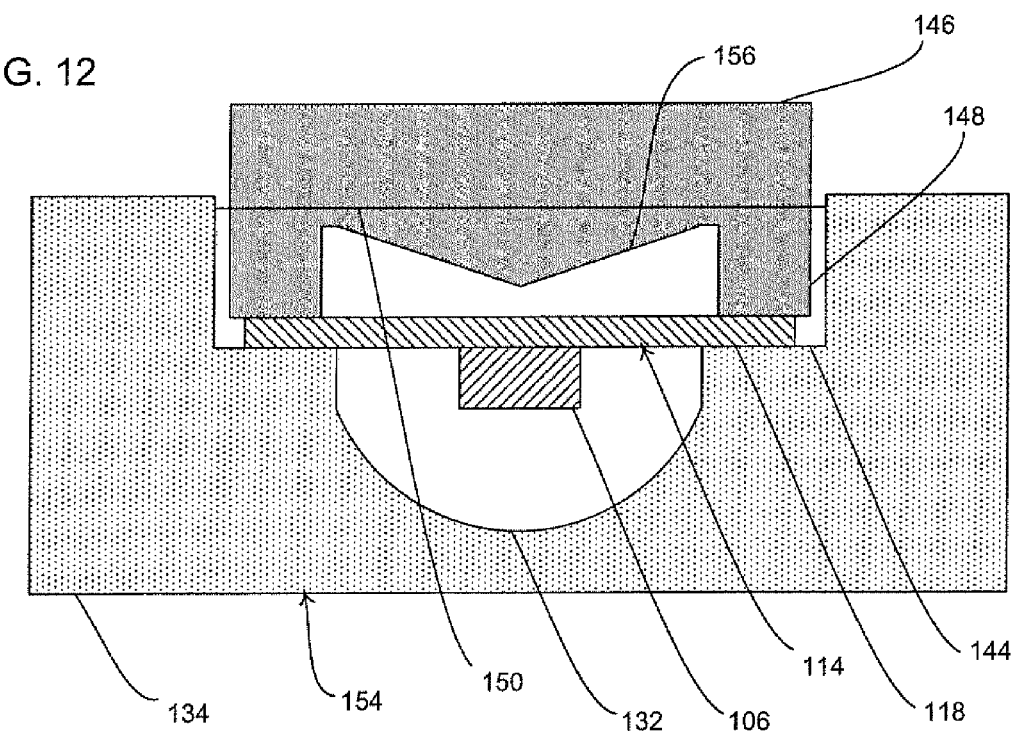
FIG. 12 is a cross-sectional view similar to FIG. 7 but showing an alternative embodiment wherein the LED light strip assembly has a mounting groove.
Figure 13:
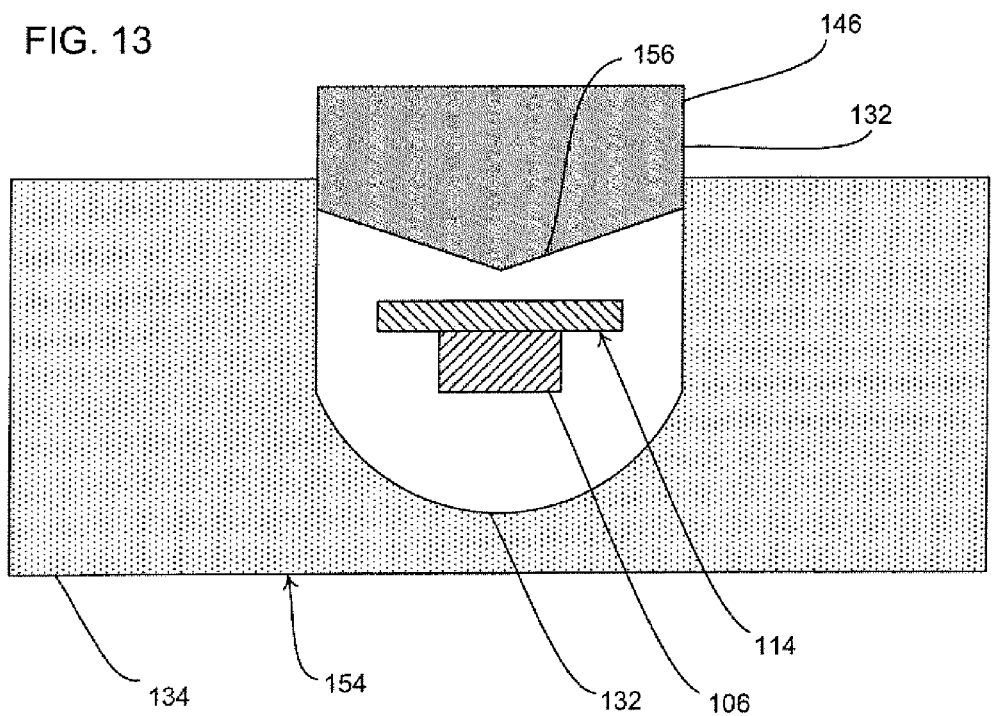
FIG. 13 is a cross-sectional view similar to FIG. 8 but showing the alternative embodiment of FIG. 12.
Figure 17:
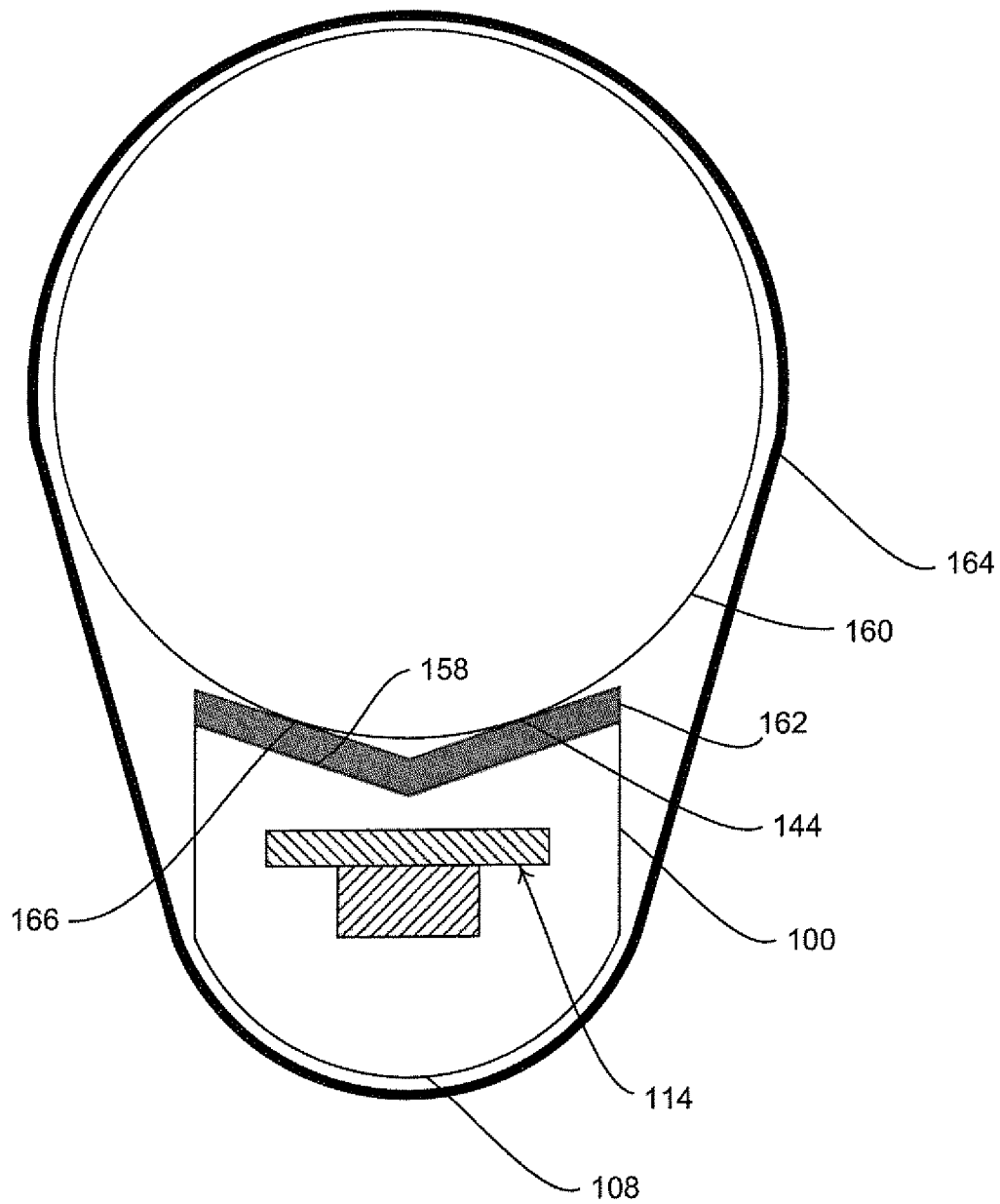
FIG. 17 is a cross-sectional view Showing the encapsulated LED light strip assembly of FIGS. 12 to 14 secured to a bicycle frame tube.
Figure 25:
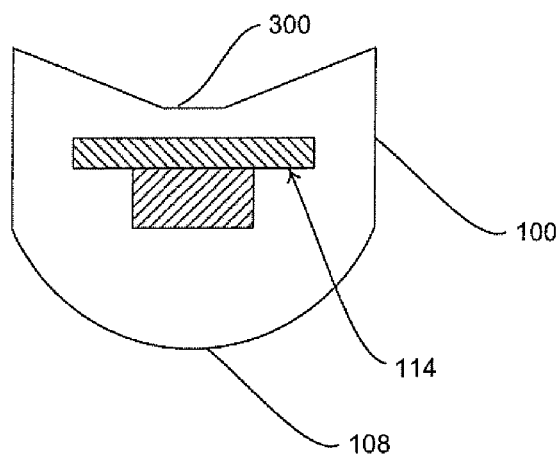
FIG. 25 is a cross-sectional view similar to FIG. 16 but showing a variation of the mounting groove.

FIGS. 12 and 13 show a mold 154 according to an alternative embodiment of the invention. The mold 154 is a double-sided mold used to mold a desired profile or shape on both the front and rear sides of the flexible housing 108 so that one of the sides does not have to be flat like in the first embodiment described above. FIGS. 12 and 13 are similar to FIGS. 7 and 8, and show that the assembled flexible LED light strip 114 is supported in the mold cavity 132 by its support tabs 118 on the ledges 144 and the support tabs 118 are fixed between the support ledges 144 and mating legs 148 of the secondary substrate 146 of the mold 154 to secure the assembled flexible LED light strip 114 against movement within the cavity 132 in all three directions. The assembled flexible LED light strip 114 is constrained within the cavity 132 so that the mold material will entirely surround it. However, unlike the first embodiment, the secondary substrate 146 of the mold 154 has a profile 156 shaped to mold the side of the flexible housing 108 opposite the bottom of the cavity 132. The illustrated profile 156 is shaped to mold a mounting groove 158 having a V-shaped cross section and extending the full length of the flexible housing 108 on the rear side of the flexible housing 108 including the strain relief 142. The illustrated groove 158 is sized and shaped to receive a circular-shaped or otherwise rounded tube 160 of a bicycle frame so that the tube 160 extends the entire length of the housing 108 such that the groove is open at each end and creates two points of contact 166 (in cross-section, or line contact extending in the lengthwise direction) between the encapsulated flexible LED light strip 100 and the round tube 160 as shown in FIG. 17 and described in more detail hereinafter. The illustrated V-shaped groove 158 has an angle of about 120 degrees between contact surfaces and suitably fits a bicycle frame tube 160 having a diameter between 12 mm and 60 mm but any other suitable angle between contact surfaces may be alternatively used. It is noted that the V-shaped groove 158 can alternatively have any suitable modification such as the V-shaped groove 300 shown in FIG. 25 wherein the bottom of the V is truncated. This modified V-shaped groove 300 may offer some advantages in manufacturing or in adapting to both round and flat attachment surfaces. Importantly, this V-shaped groove 300 creates the same stable two-point mount that the prior described V-shaped groove 158 creates when placed against a variety of different sizes of round tubing.

Figure 26:
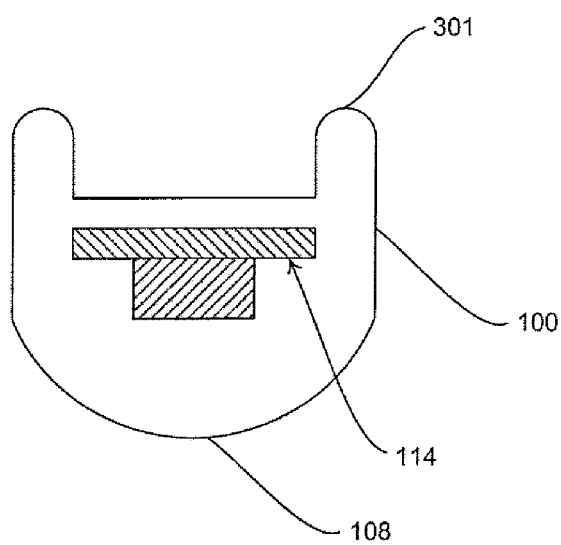
FIG. 26 is a cross-sectional view similar to FIGS. 16 and 25 but showing another variation of the mounting groove.
Figure 27:
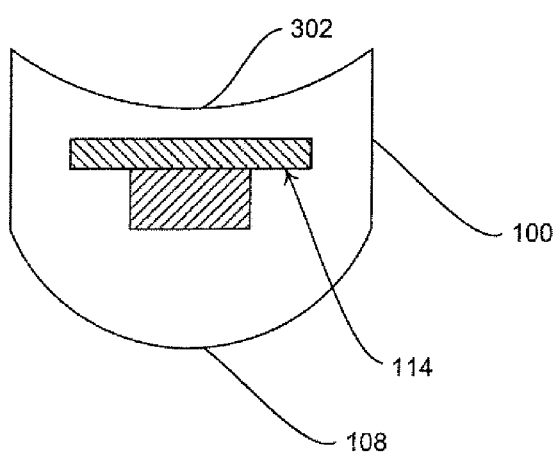
FIG. 27 is a cross-sectional view similar to FIGS. 16, 25, and 27 but showing another variation of the mounting groove.

The mounting groove can alternatively have any other suitable shape to form a two-point mount. FIG. 26 shows a housing 108 having a mounting groove 301 with an alternative shape that forms a two-point mount with some diameters of round tube. This shape is less preferred than the V-shaped mounting grooves 158, 300 discussed above because the range of tube sizes that can be used is less. FIG. 27 shows a housing 108 having a concave mount surface 302. This shape forms a stable mount for only a limited range of tube sizes whose curvature is close to the curvature of the mounting surface 302. The range of tube sizes that can be stably mounted with this shape depends on the flexibility of the molded material to conform to different tube sizes. It is noted that the profile 156 can alternatively have any desired shape other than mounting grooves.

The mold secondary substrate 146 mates with the mold primary substrate 134 to form an enclosed cavity 132 which is filled with the liquid mold material. Note that there may be overflow holes utilized to allow excess material, bubbles, and the like to escape. The fill level 150 is located at or above the height of the profile 156 of the secondary substrate 146 of the mold 154 to ensure fully filling the mold cavity 132.

Figure 14:
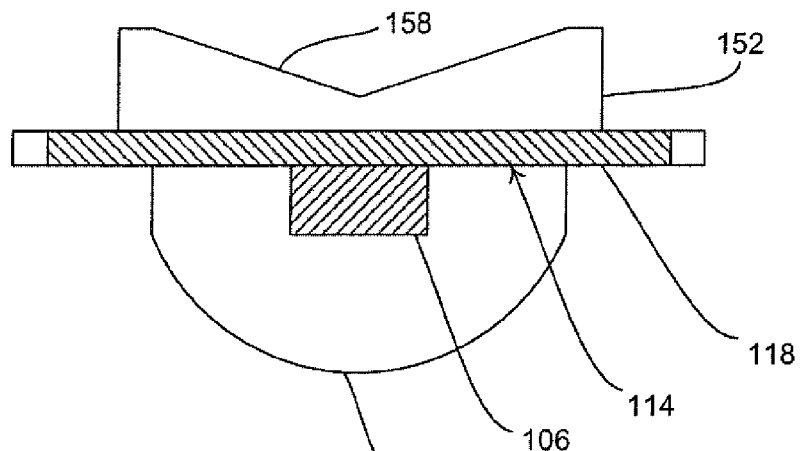
FIG. 14 is a cross-sectional view similar to FIG. 9 but showing the alternative embodiment of FIGS. 12 and 13.

FIGS. 4 and 14 show the encapsulated flexible LED light strip 100 after it is removed from the mold 154 and the o-ring seal 140 has been removed from the cable 124. After removing the encapsulated LED light strip 100 from the mold 154, the majority of the support tabs 118 and excess molded plastic material 152 in the area of the support tabs 118 are removed just like the first embodiment. The support tabs 118 and excess molded plastic material 152 can be trimmed in any suitable manner such as, for example, a knife, saw, or the like.

Figure 15:
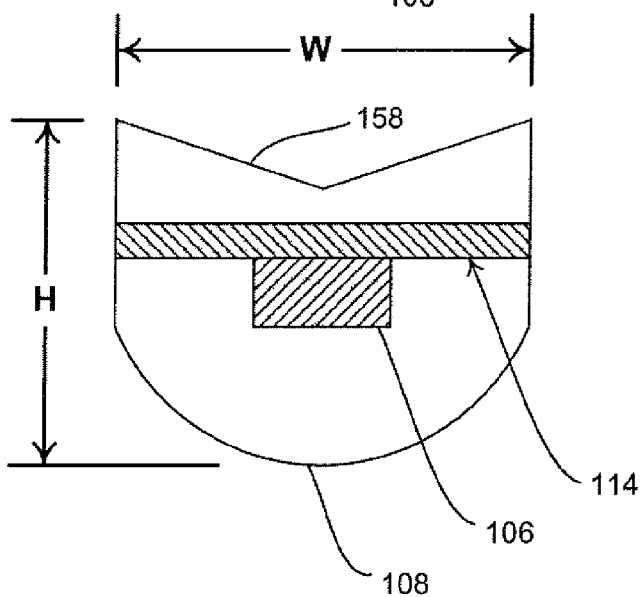
FIG. 15 is a cross-sectional view similar to FIG. 10 but showing the alternative embodiment of FIGS. 12 to 14.
Figure 16:
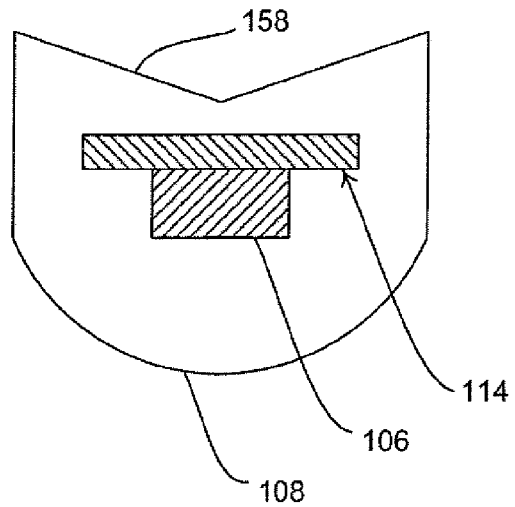
FIG. 16 is a cross-sectional view similar to FIG. 11 but showing the alternative embodiment of FIGS. 12 to 15.

FIGS. 6, 15, and 16 show the finished encapsulated flexible LED light strip 100. The support tabs 118 have been substantially cut off or trimmed so that both of the lateral sides of the encapsulated flexible LED light strip 100 are substantially planar and have a substantially straight continuous profile. Encapsulated in this manner, the assembled flexible LED light strip 114 is fully encapsulated by the flexible housing 108 on all sides except the cut edges of the support tabs 118 along the lateral sides of the encapsulated flexible LED light strip 100. It is noted however, that the LED light circuit 104 and all electronic components 106, 122 are fully encapsulated by the flexible housing 108 on all sides.

FIG. 17 shows the encapsulated flexible LED light strip 100 having a V-shaped mounting groove 158 on its back affixed to a common circular-shaped bicycle frame tube 160. The illustrated encapsulated flexible LED light strip 100 is affixed with double-sided tape 162 between the encapsulated flexible LED light strip 100 and the tube 160 and with a strap 164 tightened around both the encapsulated flexible LED light strip 100 and the tube 160. It is noted that alternatively only the tape 162 or the strap 164 can be used. The double-sided tape 162 can be rubberized to create additional surface contact for additional adhesion. Glue or other adhesive means can be alternatively used in place of the double sided tape 162. The illustrated strap 164 is a plastic cable-tie but the strap 164 can alternatively be an integrated strap permanently integrated with the housing during the molding process and of the same flexible material as the flexible housing, a metal pipe-clamp, or any other suitable strap. The double-sided tape 162 can run the entire length of the strip 140. Two or more straps 164 can be used as needed to secure the encapsulated flexible LED light strip 100 along its length. The use of the illustrated V-back groove 158 creates two points of contact 166 (in cross-section, or line contact extending in the lengthwise direction) between the encapsulated flexible LED light strip 100 and the round tube 160, that provide a stable mount that does not rock back and forth on the round tube 160.

FIG. 18 shows an LED light circuit 104 for the encapsulated flexible LED light strip 100 which is configured so that the LED lights 106 are individually addressable, that is, individually controllable. It is noted that the encapsulated flexible LED light strip 100 can alternatively have any other suitable circuit and/or non-individually addressable LED lights. The illustrated LED light circuit 104 is entirely contained within the encapsulated flexible LED light strip 100 on the flexible printed circuit board 116. The benefit of these circuits in an LED light circuit 104 having individually addressable or controllable LED lights 106 is to reduce the number of wires in the cable and the size of the cable connecting the LED light strip 100 to the external controller and power source. A commodity LED driver chip 168 (such as a 74595 type chip or any other similar chip) is used to individually control the eight LED lights 106 from a serial electrical signal with latched output (aka buffered output). Eight current limiting circuits 170 are used, one for each of the LED lights 106. Each current limiting circuit 170 comprises a resistor, transistor, or the like.

The current limiting circuits 170 may be incorporated internally to the LED driver chip 168, or may be a separate circuit. The illustrated driver chip 168 has eight output signals QA . . . QH, one for each of the LED lights 106. Other suitable driver chips 168 may have other numbers of outputs and control other quantities of the LED lights 106 with 1 to 16 of the LED lights 106 being common. A wide variety of other common LED driver chips 168 can be used instead of the 74595 chip and perform similar functions, and may have different numbers of output signals. An LED light strip 114 may have one or more LED driver chips 168 in order to control larger numbers of LED lights 106 than is possible with a single chip 168. Circuits which combine multiple LED driver circuits as described above for this purpose are widely known and used.

The illustrated LED driver chip 168 is controlled from an external control circuit located in the external controller and power source 112 via a serial electrical signal. The illustrated LED driver chip 168 has six electrical signal inputs including: power (VCC), register clock (RCK), serial clear (SCL), ground (GND), serial data in (SER), and serial clock (SCK). Other LED driver chips 168 require alternative but functionally analogous inputs. The illustrated power (VCC), ground (GND), serial data in (SER), and serial clock (SCK) signals are provided through the four electrical wires 126 of the illustrated cable 124 from the external controller and power source 112. However, the illustrated LED light circuit 104 internally generates the latch (RCK) and serial clear (SCL) signals within the encapsulated LED light strip 100 resulting in a reduction of two electrical wires 126 which are needed to connect the external controller and power source 112. The register clock signal is sometimes referred to as the "latch" signal. The serial clear signal is sometimes referred to as the "enable" signal. The illustrated RCK signal is generated by an RCK circuit 172 located within the encapsulated flexible LED light strip 100 which does not need to be controlled through a separate electrical wire 126 from the external controller and power source 112. The illustrated SCL signal is generated by an SCL circuit 174 located within the encapsulated flexible LED light strip 100 which does not need to be controlled through a separate electrical wire 126 from the external controller and power source 112. It is noted that one or both of the internal RCK and SCL circuits 172, 174 can be eliminated as desired so that their functions are provided within the external controller and power source 112.

FIG. 19 shows a suitable SCL circuit 174 to generate the SCL signal. The illustrated SCL circuit 174 is a simple R-C delay circuit comprising a resistor 176 and a capacitor 178 connected such that the generated SCL signal is high for a short period of time when the power is applied to the SCL circuit 174, and low after that. It is noted that any other suitable SCL circuit 104 that performs the function of keeping the SCL signal active for a short time after power is applied and de-active afterwards can alternatively be utilized. The purpose of this SCL circuit 174 is to keep the outputs QA . . . QH of the LED driver chip 168 disabled for a short time after power is supplied to the LED light circuit 104. This circuit eliminates the need for an externally controlled SCL signal in some applications, thereby eliminating one wire from the cable connecting the LED light strip 100 to the external controller and power source and thus reducing the size and cost of the cable.

FIG. 19 also shows a suitable RCK circuit 172 to generate the RCK signal. The illustrated RCK circuit 172 comprises a resistor 180, a capacitor 182 and a transistor 184. The purpose of this RCK circuit 172 is to wait until new serial data has finished being sent from the master controller 112 via the SER signal line, and then automatically latch the new data and set new output values of QA . . . QH. The RCK circuit 172 watches the SER signal line for any data, and after a predetermined period of time of no data, it sends the RCK signal. The illustrated RCK circuit 172 is an example of how the RCK signal can be generated but any other suitable RCK circuit 172 can alternatively be utilized. This circuit eliminates the need for an externally controlled RCK signal in some applications, thereby eliminating one wire from the cable connecting the LED light strip 100 to the external controller and power source and thus reducing the size and cost of the cable.

To work with the illustrated RCK circuit 172, the SER and SCK signals are modified specially. In the common usage, one bit of data is transferred by setting the SER signal and then toggling the SCK signal. Additional bits of data are transferred by repeating this process. Using a circuit for generating RCK automatically, the SER signal may be toggled additionally without toggling SCK as a signal to the RCK generation circuit. It is noted that alternatively, the entire control circuit can be provided within the encapsulated flexible LED light strip 100 so that only power wires connect the strip 100 to an external power source and all control signals are generated internally.

Figure 23:
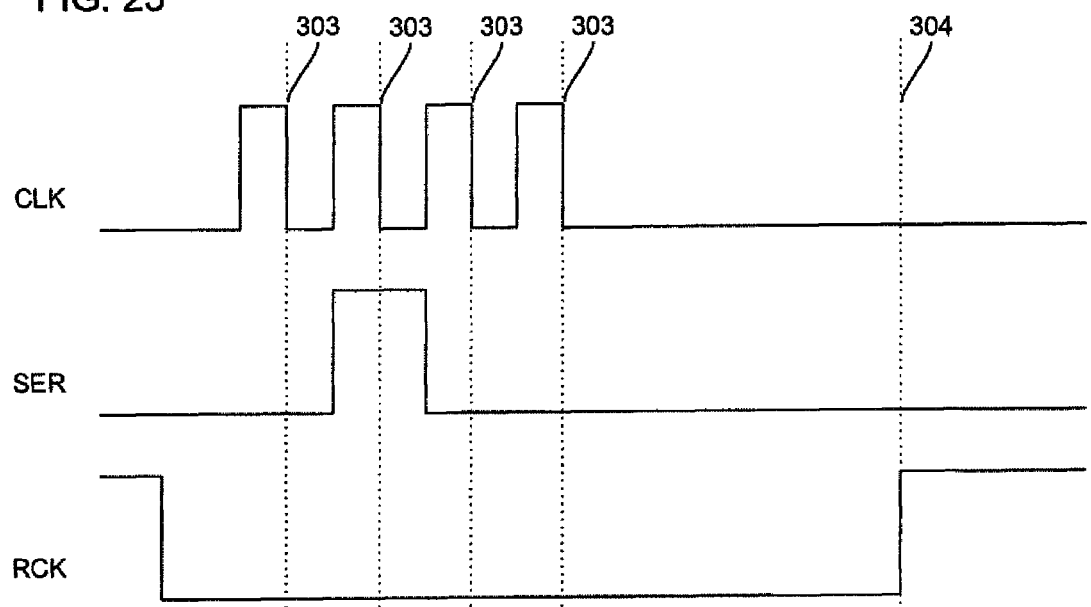
FIG. 23 is a diagrammatic view of a simplified electrical signal timing diagram used with common LED driver chips.

FIG. 23 shows a typical simplified electrical signal timing diagram used with common serial LED driver chips. The diagram shows the timing of the CLK, SER and RCK signals used to transfer 4 bits of data to the LED driver chip and to latch the values to the chip output after transmission. Only 4 bits are shown for simplicity but 8 bits or another number of bits may be similarly transferred. CLK, SER and RCK are all individually controlled from an external driver circuit. Each of the data bits {0, 1, 0, 0} is transferred sequentially on the falling edges of the CLK signal 303. The data is latched to the chip outputs on the rising or high level of the RCK signal 304. Similar timings and timing diagrams are well known and used with many different LED driver chips. Common LED driver chips may use inverted versions of these signals and other variations, however the method of clocking serial data and latching it to the output is well known and widely used.

Figure 24:
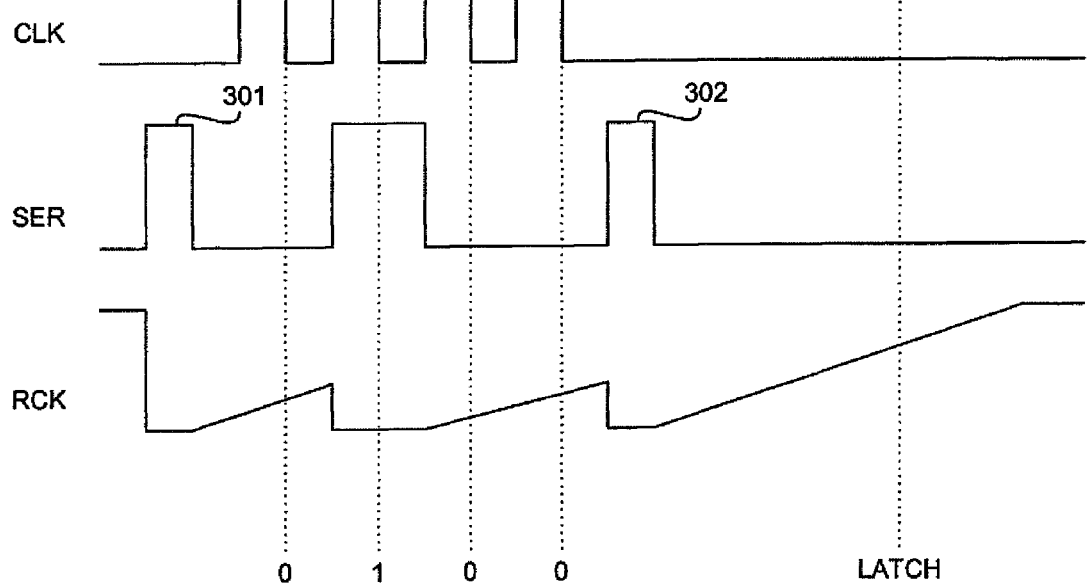
FIG. 24 is a diagrammatic view of a of a simplified electrical signal timing diagram used with an enable signal generation circuit of the flexible LED light strip of FIG. 19.

FIG. 24 shows a modified timing diagram used with the RCK generation circuit 172. The SER signal is toggled independently of the CLK signal before data transmission starts 301 and after it completes 302. This action causes the RCK generation circuit to keep the RCK signal from transitioning high until after all data is sent. The SER signal can also be similarly toggled high in the middle of the data transmission when larger amounts of data are being transferred. Any of the signals may be inverted or have other variations to meet the needs of specific LED driver chips.

Figure 21:
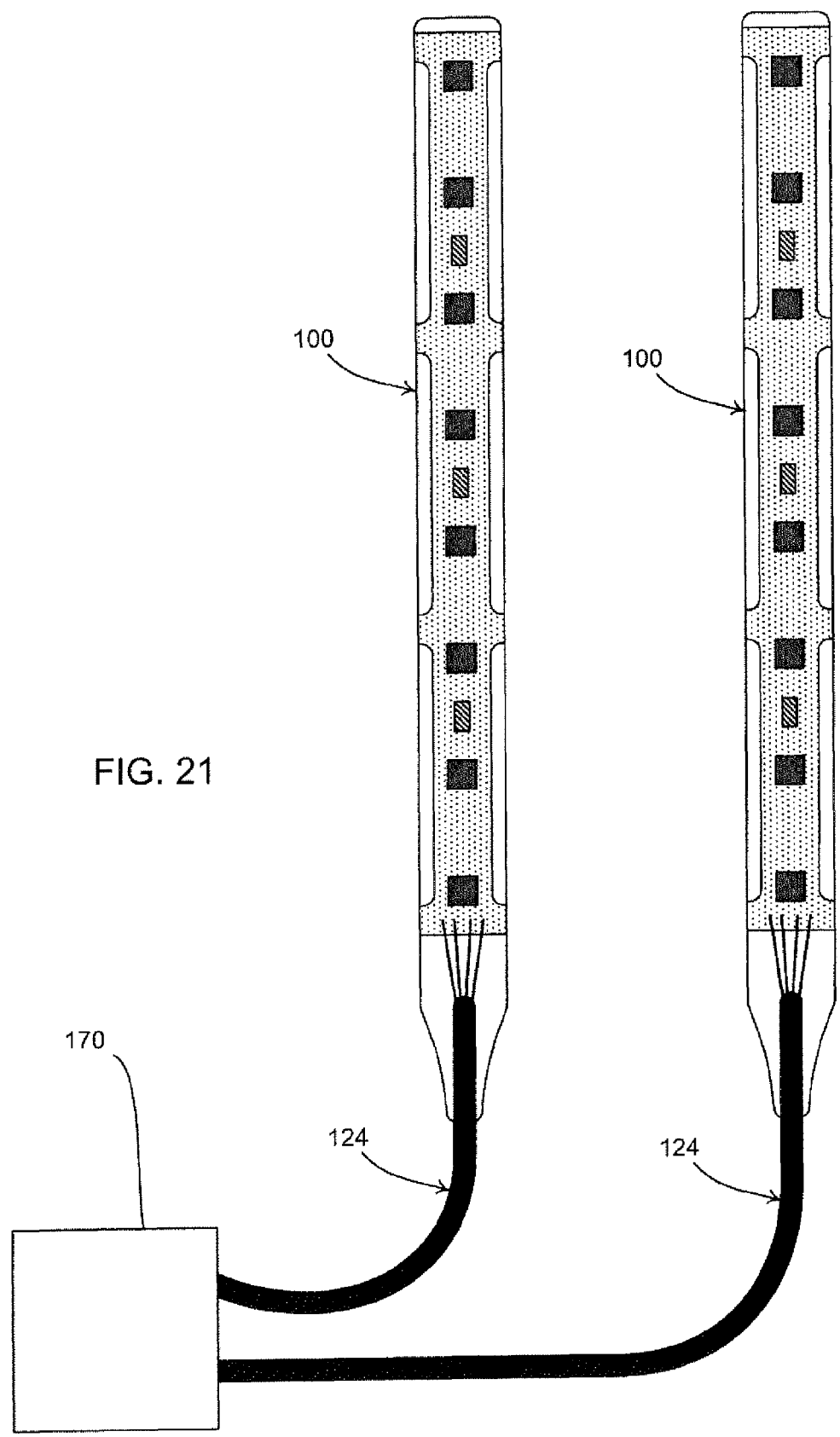
FIG. 21 is a diagrammatic view of another embodiment of the present invention wherein a pair of the flexible LED light strips of FIGS. 1 to 19 are electrically connected to a common external master controller and power source.

FIG. 21 shows two encapsulated flexible LED light strips 100 each with a flexible electrical cable 124 connected to a single external controller and power source 170. It is noted that more than two of the LED lights strips 100 can be connected to the single external controller and power source when desired. In bicycle applications it is typically desirable to have a set of two to eight of the LED light strips 100. The circuitry of the external controller and power source 170 used to drive the encapsulated flexible LED light strips 100 is widely known and used in existing products. The combination of two or more of the encapsulated flexible LED light strips 100 defined above with a single external controller and power source 170 and a bicycle allows a special advantage. The two or more light strips 100 can be mounted on the bicycle symmetrically, and the controller and power source 170 can cause each of the light strips 100 to display the same or coordinated colors and/or patterns, so in combination the bicycle can be illuminated in a symmetrically and/or coordinated fashion. The light strips 100 can be mounted for example on either side of the rear stays, the down tube, the front fork, or any other suitable place on the bicycle. The length of the cable 124 can be approximately 18 inches but any other suitable length can be utilized.

Figure 22:
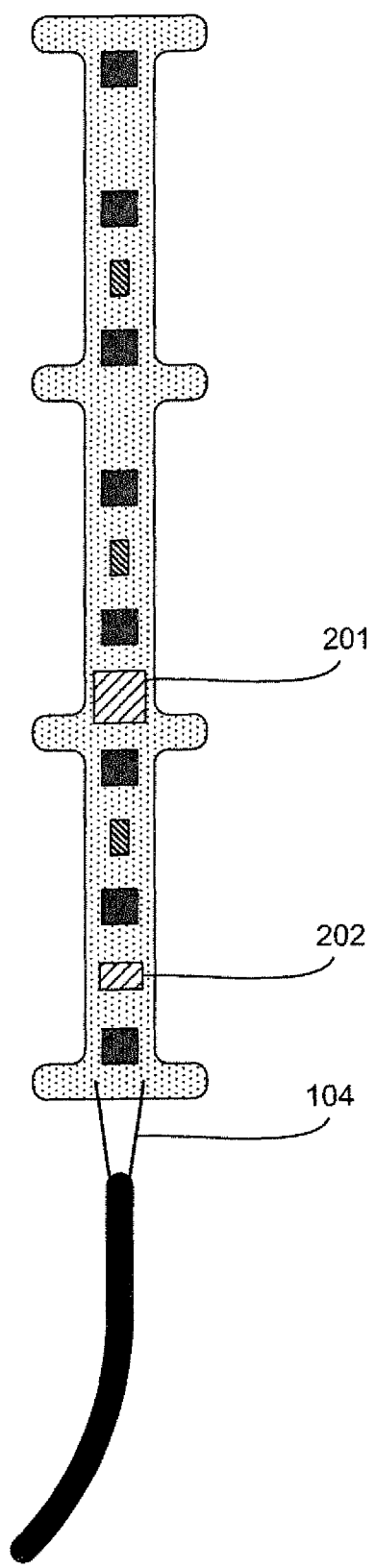
FIG. 22 is a diagrammatic view of another embodiment of the present invention wherein the flexible LED light strip of FIGS. 1 to 19 includes an internal controller and an infrared sensor so that the light strip can be controlled by a handheld infrared transmitter.

FIG. 22 shows a flexible LED strip 114 with an internal controller 201 that drives the LED driver circuitry. The cable 124 has only two electrical wires 104 for connection to an external power source. Combining the internal controller 201 along with the LED driver circuitry is well known and commonly used in many products. In order to allow user control of colors, patterns, and power, a wireless sensor or receiver 202 is also internally incorporated into the light strip 114. The use of the internal controller 201 and wireless receiver or sensor 202 allows the fully encapsulated light strip 100 to be controlled without buttons by using a low cost wireless transmitter or actuator. The illustrated wireless transmitter and receiver are a infrared wireless transmitter and receiver but any other suitable type of wireless transmitter or actuator and receiver or sensor can alternatively be utilized such as, for example, magnetic actuators and sensors, radio frequency transmitters and receivers, and the like. Infrared transmitters and receivers and their method of construction an operation are widely known and used to control many products such as televisions. When using an embodiment with a magnetic wireless control, the sensor can be a magnetic sensor such as a Hall sensor or inductive coil and the actuator can be any common magnet. The combination of the wireless receiver or sensor 202 and the controller 201 into the fully encapsulated LED light strip 114 allows the construction of a light strip 114 that can display allows the construction of a light strip 114 that can display colors and patterns on its independently controlled LED lights 106 with only a two wire power cable to an external power source, and can be turned on and off and have colors and/or patterns controlled by the user by wireless remote control.

It is noted that each of the features or attributes of the above described embodiments and variations can be used in combination with any of the other features and attributes of the above described embodiments and variations as desired.

From the foregoing disclosure it will be apparent that the disclosed encapsulated flexible LED light strips have the advantages that the flexible electrical wires and contoured strain relief for the flexible electrical wires are integrally formed as part of the encapsulated flexible LED light strip to maintain complete environmental and physical protection and eliminate the use of any non-flexible portions of the encapsulated flexible LED light strip such as an electrical connector. Additionally it will be apparent that the disclosed encapsulated flexible LED light strips are manufactured in a cost efficient manner, and are impervious to moisture penetration and highly resistant to physical damage, thereby allowing the strips to be used in a variety of applications and environments. Furthermore, the disclosed V-back shape of the encapsulated flexible LED light strip is especially useful for attachment to the round tubing of a bicycle frame. Moreover, the disclosed flexible light strips have internal electrical circuits allowing a reduction in the number of electrical wires between the strip and its associated external control and power unit.

From the foregoing disclosure and detailed description of certain preferred embodiments, it is also apparent that various modifications, additions and other alternative embodiments are possible without departing from the true scope and spirit of the present invention. The embodiments discussed were chosen and described to provide the best illustration of the principles of the present invention and its practical application to thereby enable one of ordinary skill in the art to utilize the invention in various embodiments and with various modifications as are suited to the particular use contemplated. All such modifications and variations are within the scope of the present invention as determined by the appended claims when interpreted in accordance with the benefit to which they are fairly, legally, and equitably entitled.

What is claimed is:

1. An encapsulated flexible LED light strip comprising:
a flexible substrate having a rectangular-shaped central portion and a plurality of support tabs laterally extending from elongate lateral sides of the central portion and spaced apart along the elongate lateral sides of the central portion;
an LED light circuit at the central portion of the flexible substrate and having at least three spaced-apart LED lights;
a substantially voidless flexible plastic housing encapsulating the LED light circuit and the central portion of the flexible substrate;
wherein the flexible plastic housing has a length extending between opposed ends, a width extending between opposed lateral sides, and a thickness extending between opposed front and rear sides;
wherein the encapsulated flexible LED light strip has a minimum flexibility of the length such that when the length is shorter than 200 mm every 80 mm section of the length can bend over an arc of 20 degrees and when the length is 200 mm or longer every 150 mm section of the length can bend over an arc of 20 degrees;
wherein the length is in the range of 80 mm to 2.0 m;
wherein the length to the width has a ratio of at least 8:1;
at least one flexible electrical cable extending from the LED light circuit and through the flexible plastic housing; and
wherein the flexible plastic housing forms a contoured strain relief for the at least one flexible electrical cable.

2. The encapsulated flexible LED light strip of claim 1, wherein the LED lights are at a front side of the flexible substrate and facing the front side of the flexible plastic housing.

3. The encapsulated flexible LED light strip of claim 1, wherein the flexible plastic housing fully encapsulates the LED light circuit and the central portion of the flexible substrate on all sides to form a seamless substantially voidless barrier.

4. The encapsulated flexible LED light strip of claim 1, wherein the LED light circuit is configured so that the LED lights are individually controllable.

5. The encapsulated flexible LED light strip of claim 4, wherein the LED light circuit located within the encapsulated flexible LED light strip is configured to internally generate a latch signal based upon an externally supplied clock and serial data signal and wherein the flexible electrical cable contains three to six flexible insulated electrical wires.

6. The encapsulated flexible LED light strip of claim 4, wherein the LED light circuit located within the encapsulated flexible LED light strip is configured to internally generate an enable signal based upon an externally supplied power signal and wherein the flexible electrical cable includes three to six flexible insulated electrical wires.

7. The encapsulated flexible LED light strip of claim 1, wherein the LED light circuit includes an internal controller and at least one of a wireless receiver and a wireless sensor so that the LED light circuit can be controlled by at least one of a wireless transmitter and a wireless actuator.

8. The encapsulated flexible LED light strip of claim 7, wherein the wireless sensor is a magnetic sensor and the wireless actuator is a common magnet.

9. The encapsulated flexible LED light strip of claim 1, further comprising at least one of a mounting tab and a mounting strap integrally molded with the housing.

10. An encapsulated flexible LED light strip comprising:
a flexible substrate having a rectangular-shaped central portion and a plurality of support tabs laterally extending from elongate lateral sides of the central portion and spaced apart along the elongate lateral sides of the central portion;
an LED light circuit at the central portion the flexible substrate and having at least three spaced-apart LED lights;
a substantially voidless flexible plastic housing encapsulating the LED light circuit and the central portion of the flexible substrate;
wherein the flexible plastic housing has a length extending between opposed ends, a width extending between opposed lateral sides, and a thickness extending between front and rear sides;
wherein the encapsulated flexible LED light strip has a minimum flexibility of the length such that when the length is shorter than 200 mm every 150 mm section of the length can bend over an arc of 20 degrees and when the length is 200 mm or longer every 150 mm section of the length can bend over an arc of 20 degrees;
wherein the length is in the range of 80 mm to 2.0 m;
wherein the length to the width has a ratio of at least 8:1;
at least one flexible electrical cable extending from the LED light circuit and through the flexible plastic housing at one of the ends; and
wherein the LED light circuit is configured so that the LED lights are individually controllable, wherein the LED light circuit located within the encapsulated flexible LED light strip is configured to internally generate a latch signal based upon an externally supplied clock and serial data signal, and wherein the flexible electrical cable connecting the encapsulated strip contains three to six flexible insulated electrical wires.

11. The encapsulated flexible LED light strip of claim 10, wherein the LED lights are at a front side of the flexible substrate and facing the front side of the flexible plastic housing.

12. The encapsulated flexible LED light strip of claim 10, wherein the flexible plastic housing fully encapsulates the LED light circuit and the central portion of the flexible substrate on all sides to form a seamless substantially voidless barrier.

13. The encapsulated flexible LED light strip of claim 10, wherein the LED light circuit located within the encapsulated flexible LED light strip is configured to internally generate an enable signal based upon an externally supplied power signal.

14. The encapsulated flexible LED light strip of claim 10, wherein the flexible plastic housing forms a contoured strain relief for the at least one flexible electrical cable.

15. The encapsulated flexible LED light strip of claim 10, wherein the LED light circuit includes an internal controller and at least one of a wireless receiver and a wireless sensor so that the LED light circuit can be controlled by at least one of a wireless transmitter and a wireless actuator.

16. The encapsulated flexible LED light strip of claim 15, wherein the wireless sensor is a magnetic sensor and the wireless actuator is a common magnet.

17. The encapsulated flexible LED light strip of claim 10, further comprising at least one of a mounting tab and a mounting strap integrally molded with the housing.

18. An LED light system for a bicycle comprising:
a set of two to eight encapsulated flexible LED light strips each comprising:
a flexible substrate having a rectangular-shaped central portion and a plurality of support tabs laterally extending from elongate lateral sides of the central portion and spaced apart along the elongate lateral sides of the central portion;
an LED light circuit at the central portion of the flexible substrate and having at least three spaced-apart LED lights;
a voidless flexible plastic housing encapsulating the LED light circuit and the central portion of the flexible substrate;
wherein the flexible plastic housing has a length extending between opposed ends, a width extending between opposed lateral sides, and a thickness extending between front and rear sides;
wherein each of the encapsulated flexible LED light strips has a minimum flexibility of the length such that when the length is shorter than 200 mm every 150 mm section of the length can bend over an arc of 20 degrees and when the length is 200 mm or longer every 150 mm section of the length can bend over an arc of 20 degrees;
wherein the LED lights of each of the LED light strips are at a front side of the flexible substrate and facing the front side of the flexible plastic housing;
wherein the length is in the range of 80 mm to 2.0 m;
wherein the length to the width has a ratio of at least 8:1; and
at least one flexible electrical cable extending from the LED light circuit and through the flexible plastic housing;
an external controller and power source electrically connected to each of the two to eight encapsulated flexible LED light strips by the flexible electrical cables; and
wherein the set of encapsulated flexible LED light strips can provide a coordinated display when the set of encapsulated flexible LED light strips are mounted on the bicycle.

19. The LED light system of claim 18, wherein the rear side of each of the LED light strips includes a groove having a V-shape cross-section and extending between the ends.

20. The LED light system of claim 18, wherein the flexible plastic housing of each of the LED light strips forms a contoured strain relief for the at least one flexible electrical cable.

21. The LED light system of claim 18, wherein the LED lights of each of the LED light strips are individually controllable.

22. The LED light system of claim 21, wherein the LED light circuit of each of the LED light strips is configured to internally generate a latch signal based upon an externally supplied clock and serial data signal and wherein the flexible electrical cable includes three to six flexible insulated electrical wires.

23. The LED light system of claim 21, wherein the LED light circuit of each of the LED light strips is configured to internally generate an enable signal based upon an externally supplied power signal and wherein the flexible electrical cable includes three to six flexible insulated electrical wires.

24. The LED light system of claim 18, each of the LED light strips further comprising at least one of a mounting tab and a mounting strap integrally molded with the housing.

25. The LED light system of claim 18, wherein the flexible plastic housing of each of the LED light strips fully encapsulates the LED light circuit and the central portion of the flexible substrate on all sides to form a seamless substantially voidless barrier.

26. The LED light system of claim 18, wherein the flexible substrate is fully encapsulated by the flexible plastic housing on all sides except lateral edges of the support tabs at the opposed lateral sides of the flexible plastic housing.

27. The LED light system of claim 18, wherein the support tabs are free of electrical components.

28. An encapsulated flexible LED light strip comprising:
- a flexible substrate having a rectangular-shaped central portion and a plurality of support tabs laterally extending from elongate lateral sides of the central portion and spaced apart along the elongate lateral sides of the central portion;
- an LED light circuit at the central portion of the flexible substrate and having at least three spaced-apart LED lights;
- a substantially voidless flexible plastic housing encapsulating the LED light circuit and the central portion of the flexible substrate;
- wherein the flexible plastic housing has a length extending between opposed ends, a width extending between opposed lateral sides, and a thickness extending between opposed front and rear sides;
- at least one flexible electrical cable extending through the flexible plastic housing to the LED light circuit;
- wherein the encapsulated flexible LED light strip has a minimum flexibility of the length such that when the length is shorter than 200 mm every 150 mm section of the length can bend over an arc of 20 degrees and when the length is 200 mm or longer every 150 mm section of the length can bend over an arc of 20 degrees;
- wherein the length is in the range of 80 mm to 2.0 m;
- wherein the length to the width has a ratio of at least 8:1.

29. The encapsulated flexible LED light strip of claim 28, wherein the flexible plastic housing fully encapsulates the LED light circuit and the central portion of the flexible substrate on all sides to form a seamless substantially voidless barrier.

30. The encapsulated flexible LED light strip of claim 28, wherein the flexible electrical cable includes at least two flexible insulated electrical wires extending through the flexible plastic housing and wherein the flexible plastic housing forms a contoured strain relief for the at least one flexible electrical cable.

31. The encapsulated flexible LED light strip of claim 28, wherein the LED light circuit is configured so that the LED lights are individually controllable.

32. The encapsulated flexible LED light strip of claim 31, wherein the LED light circuit is configured to internally generate a latch signal based upon an externally supplied clock and serial data signal and wherein the flexible electrical cable includes three to six flexible insulated electrical wires.

33. The encapsulated flexible LED light strip of claim 31, wherein the LED light circuit is configured to internally generate an enable signal based upon an externally supplied power signal and wherein the flexible electrical cable includes three to six flexible insulated electrical wires.

34. The encapsulated flexible LED light strip of claim 28, wherein the LED light circuit includes an internal controller and at least one of a wireless receiver and a wireless sensor so that the LED light circuit can be controlled by at least one of a wireless transmitter and a wireless actuator.

35. The encapsulated flexible LED light strip of claim 34, wherein the wireless sensor is a magnetic sensor and the wireless actuator is a common magnet.

36. The encapsulated flexible LED light strip of claim 28, further comprising at least one of a mounting tab and a mounting strap integrally molded with the housing.

37. The encapsulated flexible LED light strip of claim 1, wherein the LED lights are at a front side of the flexible substrate and facing the front side of the flexible plastic housing.

38. The encapsulated flexible LED light strip of claim 37, wherein the rear side of the flexible plastic housing includes a groove having a V-shape cross-section and extending between the ends.

39. The encapsulated flexible LED light strip of claim 28, wherein the flexible substrate is fully encapsulated by the flexible plastic housing on all sides except lateral edges of the support tabs at the opposed lateral sides of the flexible plastic housing.

40. The encapsulated flexible LED light strip of claim 28, wherein the support tabs are free of electrical components.

41. The encapsulated flexible LED light strip of claim 1, wherein the flexible substrate is fully encapsulated by the flexible plastic housing on all sides except lateral edges of the support tabs at the opposed lateral sides of the flexible plastic housing.

42. The encapsulated flexible LED light strip of claim 1, wherein the support tabs are free of electrical components.

43. The encapsulated flexible LED light strip of claim 10, wherein the flexible substrate is fully encapsulated by the flexible plastic housing on all sides except lateral edges of the support tabs at the opposed lateral sides of the flexible plastic housing.

44. The encapsulated flexible LED light strip of claim 10, wherein the support tabs are free of electrical components.

\* \* \* \* \*